(12) United States Patent
Cornfeld et al.

(10) Patent No.: US 8,263,856 B2
(45) Date of Patent: Sep. 11, 2012

(54) INVERTED METAMORPHIC MULTIJUNCTION SOLAR CELLS WITH BACK CONTACTS

(75) Inventors: Arthur Cornfeld, Sandia Park, NM (US); Jacqueline Diaz, Albuquerque, NM (US)

(73) Assignee: Emcore Solar Power, Inc., Albuquerque, NM (US)

( * ) Notice: Subject to any disclaimer, the term of this patent is extended or adjusted under 35 U.S.C. 154(b) by 398 days.

(21) Appl. No.: 12/537,361

(22) Filed: Aug. 7, 2009

(65) Prior Publication Data

US 2011/0030774 A1     Feb. 10, 2011

(51) Int. Cl.
*H01L 31/00*     (2006.01)
(52) U.S. Cl. .................................................. 136/256
(58) Field of Classification Search ............... 136/256
See application file for complete search history.

(56) References Cited

U.S. PATENT DOCUMENTS

| | | | |
|---|---|---|---|
| 3,488,834 | A | 1/1970 | Baird |
| 3,964,155 | A | 6/1976 | Leinkram et al. |
| 4,001,864 | A | 1/1977 | Gibbons et al. |
| 4,255,211 | A | 3/1981 | Fraas |
| 4,338,480 | A | 7/1982 | Antypas et al. |
| 4,393,576 | A | 7/1983 | Dahlberg |
| 4,612,408 | A | 9/1986 | Moddel et al. |
| 4,881,979 | A | 11/1989 | Lewis |
| 5,019,177 | A | 5/1991 | Wanlass |
| 5,021,360 | A | 6/1991 | Melman et al. |
| 5,053,083 | A | 10/1991 | Sinton |
| 5,217,539 | A | 6/1993 | Fraas et al. |
| 5,322,572 | A | 6/1994 | Wanlass |
| 5,342,453 | A | 8/1994 | Olson |
| 5,376,185 | A | 12/1994 | Wanlass |
| 5,479,032 | A | 12/1995 | Forrest et al. |

(Continued)

FOREIGN PATENT DOCUMENTS

EP     1 109 230 A2     6/2001
(Continued)

OTHER PUBLICATIONS

U.S. Appl. No. 12/265,113, filed Nov. 5, 2008, Varghese.

(Continued)

*Primary Examiner* — Jonathan Johnson
*Assistant Examiner* — Shannon Gardner

(57) ABSTRACT

A method of manufacturing a solar cell by providing a first substrate; depositing sequentially on the first substrate a plurality of semiconductor layers, the plurality of semiconductor layers comprising a first layer and a last layer in the direction of deposition; forming a backside contact layer on the last semiconductor layer; forming on the last semiconductor layer a back cathode contact isolated from at least a first portion of the backside contact layer, the first portion forming the anode contact; attaching a second substrate on the backside contact layer and removing the first substrate to expose the first semiconductor layer and to define a front surface and an opposite back surface of a solar cell; forming a front cathode contact on the front surface of the solar cell; etching a first trench through the plurality of semiconductor layers to define an active portion of the solar cell with a first mesa structure including the front cathode contact and the anode contact and being surrounded by the first trench, the first mesa having a first sidewall in the first trench and a lateral peripheral region beyond the sidewall, and forming in the lateral peripheral region an electrically conductive layer extending from the front surface where it is electrically connected to the front cathode contact along the first sidewall of the first trench to be electrically connected to the back cathode contact.

16 Claims, 27 Drawing Sheets

U.S. PATENT DOCUMENTS

| | | | |
|---|---|---|---|
| 5,510,272 | A | 4/1996 | Morikawa et al. |
| 5,944,913 | A | 8/1999 | Hou et al. |
| 6,165,873 | A | 12/2000 | Hamada |
| 6,180,432 | B1 | 1/2001 | Freeouf |
| 6,239,354 | B1 | 5/2001 | Wanlass et al. |
| 6,252,287 | B1 | 6/2001 | Kurtz et al. |
| 6,281,426 | B1 | 8/2001 | Olson et al. |
| 6,300,557 | B1 | 10/2001 | Wanlass et al. |
| 6,300,558 | B1 | 10/2001 | Takamoto et al. |
| 6,340,788 | B1 | 1/2002 | King et al. |
| 6,482,672 | B1 | 11/2002 | Hoffman et al. |
| 6,660,928 | B1 | 12/2003 | Patton et al. |
| 6,690,041 | B2 | 2/2004 | Armstrong et al. |
| 6,951,819 | B2 | 10/2005 | Iles et al. |
| 7,071,407 | B2 | 7/2006 | Faterni et al. |
| 7,166,520 | B1 | 1/2007 | Henley |
| 7,727,795 | B2 | 6/2010 | Stan |
| 7,741,146 | B2 | 6/2010 | Cornfeld |
| 7,785,989 | B2 | 8/2010 | Sharps |
| 7,842,881 | B2 | 11/2010 | Cornfeld |
| 2002/0117675 | A1 | 8/2002 | Mascarenhas |
| 2003/0226952 | A1 | 12/2003 | Clark |
| 2004/0079408 | A1 | 4/2004 | Fetzer |
| 2004/0166681 | A1 | 8/2004 | Iles et al. |
| 2004/0200523 | A1 | 10/2004 | King et al. |
| 2005/0211291 | A1 | 9/2005 | Bianchi |
| 2005/0274411 | A1 | 12/2005 | King et al. |
| 2006/0021565 | A1 | 2/2006 | Zahler et al. |
| 2006/0112986 | A1 | 6/2006 | Atwater, Jr. et al. |
| 2006/0144435 | A1 | 7/2006 | Wanlass et al. |
| 2006/0162768 | A1 | 7/2006 | Wanlass et al. |
| 2006/0185582 | A1 | 8/2006 | Atwater, Jr. et al. |
| 2007/0137694 | A1 | 6/2007 | Foster et al. |
| 2007/0218649 | A1 | 9/2007 | Hernandez |
| 2007/0277873 | A1 | 12/2007 | Cornfeld |
| 2008/0029151 | A1 | 2/2008 | McGlynn |
| 2008/0149173 | A1 | 6/2008 | Sharps |
| 2008/0185038 | A1* | 8/2008 | Sharps ............ 136/255 |
| 2008/0245409 | A1 | 10/2008 | Varghese |
| 2009/0038679 | A1 | 2/2009 | Varghese |
| 2009/0078308 | A1 | 3/2009 | Varghese et al. |
| 2009/0078309 | A1 | 3/2009 | Stan |
| 2009/0078310 | A1 | 3/2009 | Stan |
| 2009/0078311 | A1 | 3/2009 | Stan |
| 2009/0155951 | A1 | 6/2009 | Stan et al. |
| 2009/0155952 | A1 | 6/2009 | Stan |
| 2009/0188546 | A1 | 7/2009 | McGlynn |
| 2009/0223554 | A1 | 9/2009 | Sharps |
| 2009/0229658 | A1 | 9/2009 | Stan |
| 2009/0229662 | A1 | 9/2009 | Stan |
| 2009/0272430 | A1 | 11/2009 | Cornfeld |
| 2009/0272438 | A1 | 11/2009 | Cornfeld |
| 2009/0288703 | A1 | 11/2009 | Stan |
| 2009/0314348 | A1 | 12/2009 | McGlynn |
| 2010/0012174 | A1 | 1/2010 | Varghese |
| 2010/0012175 | A1 | 1/2010 | Varghese |
| 2010/0031994 | A1 | 2/2010 | Varghese |
| 2010/0047959 | A1 | 2/2010 | Cornfeld |
| 2010/0093127 | A1 | 4/2010 | Sharps |
| 2010/0116327 | A1 | 5/2010 | Cornfeld |
| 2010/0122724 | A1 | 5/2010 | Cornfeld |
| 2010/0122764 | A1 | 5/2010 | Newman |
| 2010/0147366 | A1 | 6/2010 | Stan |
| 2010/0186804 | A1 | 7/2010 | Cornfeld |
| 2010/0203730 | A1 | 8/2010 | Cornfeld |
| 2010/0206365 | A1 | 8/2010 | Chumney |
| 2010/0229913 | A1 | 9/2010 | Cornfeld |
| 2010/0229926 | A1 | 9/2010 | Newman |
| 2010/0229932 | A1 | 9/2010 | Cornfeld |
| 2010/0229933 | A1 | 9/2010 | Cornfeld |
| 2010/0233838 | A1 | 9/2010 | Varghese |
| 2010/0233839 | A1 | 9/2010 | Cornfeld |
| 2010/0236615 | A1 | 9/2010 | Sharps |
| 2010/0248411 | A1 | 9/2010 | Cornfeld |
| 2010/0282288 | A1 | 11/2010 | Cornfeld |
| 2011/0041898 | A1 | 2/2011 | Cornfeld |

FOREIGN PATENT DOCUMENTS

| | | |
|---|---|---|
| EP | 1 863 099 A2 | 12/2007 |
| EP | 0 658 944 B1 | 4/2009 |
| FR | 2 878 076 A1 | 5/2006 |
| WO | WO 2005/015638 A1 | 2/2005 |

OTHER PUBLICATIONS

U.S. Appl. No. 12/708,361, filed Feb. 18, 2010, Cornfeld.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/775,946, filed May 7, 2010, Newman.
U.S. Appl. No. 12/813,408, filed Jun. 10, 2010, Patel.
U.S. Appl. No. 12/844,673, filed Jul. 27, 2010, Stan.
Office Action mailed Jan. 4, 2011. U.S. Appl. No. 11/445,793. (Sexl reference, double patenting rejection).
Sexl, M., et al., "MBE Growth of Metamorphic In(Ga)AIAs Buffers." 1997 IEEE International Symposium on Compound Semiconductors. Sep. 1997, pp. 49-52. IEEE, Piscataway, NJ.
Advisory Action mailed Mar. 15, 2011. U.S. Appl. No. 11/445,793.
Stan, M., et al., "High-efficiency quadruple junction solar cells using OMVPE with inverted metamorphic device structures." Journal of Crystal Growth 312 (2010), pp. 1370-1374. Elsevier, Amsterdam, Netherlands.
R. Venkatasubramanian, et al., "An Inverted-Growth Approach to Development of an IR-Transparent, High-Efficiency AlGaAs/GaAs Cascade Solar Cell." $22^{nd}$ IEEE Photovoltaic Specialists Conference, Oct. 7-11, 1991, Las Vegas, NV.
R. Venkatasubramanian, et al., "High-quality eutectic-metal-bonded AlGaAs-GaAs thin films on Si substrates." Applied Physics Letters, vol. 60, No. 7, pp. 886-888. Feb. 17, 1992. American Institute of Physics, Melville, NY.
M. Yamaguchi, "Physics and Technologies of Superhigh-Effficiency Tandem Solar Cells." Semiconductors, vol. 33, No. 9, Sep. 1999, pp. 961-964. Toyota Technological Institute, Nagoya, Japan. © 1999, American Institute of Physics.
R.R. King, et al., "Next-Generation, High-Efficiency III-V Multijunction Solar Cells." $28^{th}$ IEEE Photovoltaic Specialists Conference, Sep. 15-22, 2000, Anchorage, AK.
S. Sinharoy, et al., "Progress in the Development of Metamorphic Multi-junction III-V Space Solar Cells." Progress in Photovoltaics: Research and Applications, vol. 10, Feb. 2002, pp. 427-432. John Wiley & Sons, Ltd. Hoboken, NJ.
R.R. King, et al., "High-Efficiency Space and Terrestrial Multijunction Solar Cells Through Bandgap Control in Cell Structures." 2002 Photovoltaic Specialists Conference, Conference Record of the $29^{th}$ IEEE, May 19-24, 2002, pp. 776-781. New Orleans, LA.
M.W. Wanlass et al., "Lattice-Mismatched Approaches for High-Performance, III-V Photovoltaic Energy Converters." Proceedings of the $31^{st}$ IEEE PVSC, Jan. 3-7, 2005, Lake Buena Vista, FL.
Takamoto, T., et al., "Future Development of InGaP/(In)GaAs Based Multijunction Solar Cells." Proceedings of the $31^{st}$ IEEE PVSC, Jan. 3-7, 2005, pp. 519-524. Lake Buena Vista, FL.
Takamoto, T., et al., "InGaP/GaAs-based Multijunction Solar Cells." Progress in Photovoltaics: Research and Applications, 2005; vol. 13, pp. 495-511. Wiley InterScience, John Wiley & Sons, Ltd., Hoboken, NJ.
M.W. Wanlass et al., "Monolithic, Ultra-Thin GaInP/GaAs/GaInAs Tandem Solar Cells." 2006 IEEE $4^{th}$ World Conference on Photovoltaic Energy Conversion, May 7-12, 2006, Waikoloa, HI.
D.J. Friedman, et al., "0.7-eV GaInAs Junction for a GaInP/GaAs/GaInAs(1eV)/GaInAs(0.7eV) Four-Junction Solar Cell." 2006 IEEE $4^{th}$ World Conference on Photovoltaic Energy Conversion, May 7-12, 2006, Waikoloa, HI.
J.F. Geisz, et al., "High-efficiency GaInP/GaAs/InGaAs triple-junction solar cells grown inverted with a metamorphic bottom junction." Applied Physics Letters 91, 023502 (2007), pp. 023502-1-023502-3. Online publication Jul. 10, 2007. American Institute of Physics, Melville, NY.
P. Sharps, et al., "Inverting the triple junction improves efficiency and flexibility." Compound Semiconductor. Oct. 2007, pp. 25-28. IOP Publishing, Ltd., Bristol, England.

H. Yoon, et al., "Progress of Inverted Metamorphic III-V Solar Cell Development at Spectrolab." 33rd IEEE Photovoltaic Specialists Conference, May 11-16, 2008, San Diego, CA.

J.F. Geisz, et al., "Inverted GaInP / (In)GaAs / InGaAs Triple-Junction Solar Cells with Low-Stress Metamorphic Bottom Junctions." 33rd IEEE Photovoltaic Specialists Conference, May 11-16, 2008, San Diego, CA.

A. Cornfeld, et al., "Development of a Large Area Inverted Metamorphic Multi-junction (IMM) Highly Efficient AM0 Solar Cell." 33rd IEEE Photovoltaic Specialists Conference, May 11-16, 2008, San Diego, CA.

A. Cornfeld, et al., "Development of a Large Area Inverted Metamorphic Multi-junction Highly Efficient AM0 Solar Cell." Conference paper presented at the 33rd IEEE Photovoltaic Specialists Conference (May 11-16, 2008) on May 12, 2008. San Diego, CA. 17 pages.

M. Stan, et al., "Very High Efficiency Triple Junction Solar Cells by MOVPE." 14th International Conference of Metalorganic Vapor Phase Epitaxy. Jun. 1-6, 2008, Metz, France.

A. Cornfeld, et al., "Advances in the Performance of Inverted Metamorphic Multi-junction Solar Cells." 23rd European Photovoltaic Energy Conference, Sep. 1-5, 2008, Valencia, Spain.

"Partial European Search Report," Application No. EP 08 01 3466. Feb. 12, 2009. European Patent Office, Berlin, Germany.

"European Search Report," Application No. EP 08 01 3466. Dec. 18, 2009. European Patent Office, Berlin, Germany.

P. Wurfel. Physics of Solar Cells: from Basic Principles to Advanced Concepts. 2nd, Updated and Expanded Edition. 2009. Sections 6.4, 6.5 and 6.8. 20 pages. Wiley-VCH, Weinheim, Germany.

* cited by examiner

INVERTED METAMORPHIC MULTIJUNCTION SOLAR CELLS WITH BACK CONTACTS

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention relates to semiconductor-based solar cells. In particular, the present invention relates to solar cells including integrated semiconductor structures with back-contact cell design and to methods of manufacturing such cells.

2. Description of Related Art

Solar cells are photovoltaic devices that convert sunlight directly into electrical power.

Thin-film technology has gained widespread interest in satellite and in general space applications because of their low cost, high-density packaging, and radiation resistance. Thin-film solar cells can be in general based on different semiconductors materials, such as polycrystalline or amorphous silicon, binary to quaternary alloys of III-V semiconductors, CdTe— or copper-indium-gallium selenide (CIGS) based materials. A key issue in the development of thin-film solar cells for space applications has been the production of high-power density solar modules to be used as the primary power source for spacecraft.

Solar cells are often fabricated in single junctions or in vertical multi-junction structures, and arranged in horizontal arrays, where the individual cells are series-connected one to another.

Inverted metamorphic solar cell structures based on III-V compound semiconductor layers, such as described in M. W. Wanlass et al., "Lattice Mismatched Approaches for High Performance", III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells.

When a solar cell is fabricated on a vertical multi-junction structure, one electrical contact is usually placed on the front side of the cell (the side exposed to solar radiation), while the other electrical contact is placed on the back side of the solar cell (the side not facing the sun). Designs in which both electrical contacts are located on one side of the solar cell have recently gained particular attention since they can optimize interconnection between cells. Solar cells having both electrical contacts located on the backside of the cell are often referred to as back-contact solar cells.

US patent application No. 2008/0185038 describes a multi-junction solar cell, and in particular an inverted metamorphic solar cell, with both anode and cathode contacts on the backside of the cell. A sequence of layers of semiconductor material is deposited on a first substrate, the sequence of layers forming at least one cell of a multi-junction solar cell; a via is etched through the sequence of layers from the top surface of the layers to the first substrate; a second substrate is provided over the sequence of layers; and the first substrate is removed. A first electrode is then formed on the back side of the solar cell and an electrical connection is formed between the top cell of the multi-junction solar cell and a second electrode on the back side of the solar cell.

U.S. patent application Ser. No. 12/190,449, filed on Aug. 12, 2008 in the name of the instant assignee, discloses a method of manufacturing a solar cell by providing a first semiconductor substrate; depositing on the first substrate a sequence of layers of semiconductor material forming a solar cell including a metal contact layer; mounting a surrogate second substrate on top of the sequence of layers; removing the first substrate; simultaneously etching first and second troughs around the periphery of said solar cell, wherein the first trough lies within the second trough so as to form first and second mesa structures on the surrogate second substrate; and etching said second trough down to said metal contact layer.

SUMMARY OF THE INVENTION

The inventors have observed that, in back-contact solar cells, formation of the holes and of the conductive path to bring the front electrode, e.g., the bus bar of the front electrode, to the backside of the cell may entail rather complex manufacturing process, due to an increase of the number of process steps and to constraints in the geometry and dimension of the through-holes.

The inventors have also noted that electrical interconnection by means of standard bonding of wires, such as Kovar® wires, can be problematic because of the fragility of the solar cells, and in particular of the conductive layer electrically connecting the front electrode with the cell's backside.

It is an object of the present invention to provide a back-contact solar cell that can be manufactured with a process that is reliable and easy to perform.

It is another object of the present invention to provide a solar cell of mesa type having a contact structure connecting the front side with the back side of the cell, which is secure and robust for electrical interconnections.

It is still another object of the present invention to provide a solar cell of mesa type having a structure of the opposite polarity electrodes, which can be defined with geometries and dimensions such that standard lithography can be used, and, preferably, can be manufactured by using less costly etching processes, such as selective wet chemical etching.

A further object of the present invention is to provide a reliable and cost-effective method of manufacturing a back-contact solar cell.

Some implementations or embodiments of the invention may achieve fewer than all of the foregoing objects.

Inventors have understood that, in solar cells of mesa type, it would be beneficial to use a peripheral via for definition of the active region of an individual cell as via for a conductive path from the front electrode to the backside of the cell.

Inventors have realized that formation of a conductive pad on the backside of the cell electrically connected to the front electrode by a conductive path realized in a peripheral region outside the cell's active area can provide a robust co-located interconnection.

Briefly and in general terms, an aspect of the present invention relates to a method of manufacturing a solar cell comprising: providing a first substrate; depositing sequentially on the first substrate a plurality of semiconductor layers, the plurality of semiconductor layers comprising a first layer and a last layer in the direction of deposition; forming a backside contact layer on the last semiconductor layer; forming on the last semiconductor layer a back cathode contact isolated from at least a first portion of the backside contact layer, the first portion forming the anode contact; attaching a second substrate on the backside contact layer and removing the first substrate to expose the first semiconductor layer and to define a front surface and an opposite back surface of a solar cell;

forming a front cathode contact on the front surface of the solar cell; etching a first trench through the plurality of semiconductor layers to define an active portion of the solar cell with a first mesa structure including the front cathode contact and the anode contact and being surrounded by the first trench, the first mesa having a first sidewall in the first trench and a lateral peripheral region beyond the sidewall, and forming in the lateral peripheral region an electrical connection between the front electrode and the back cathode contact.

Another aspect of the present invention is directed to a solar cell comprising an active portion comprising a first semiconductor body having a front side surface and a backside surface and being surrounded by a plurality of peripheral sidewalls; a front cathode contact formed on the front side surface of the first semiconductor body; an anode contact formed on the back side surface of the first semiconductor body, and a back cathode contact formed on the backside surface of the first semiconductor body, wherein the back cathode contact is electrically isolated from the anode contact and is electrically connected to the front cathode contact by an electrically conductive layer extending along a first sidewall of the plurality of peripheral sidewalls.

BRIEF DESCRIPTION OF THE DRAWINGS

The present invention will be now described more fully hereinafter with reference to the accompanying drawings, in which some, but not all embodiments of the invention are shown. Drawings illustrating the embodiments are not-to-scale schematic representations. For the purpose of the present description and of the appended claims, all ranges include the maximum and minimum points disclosed and include any intermediate ranges therein, which may or may not be specifically enumerated herein.

DESCRIPTION OF THE PREFERRED EMBODIMENTS

Figure 1A:
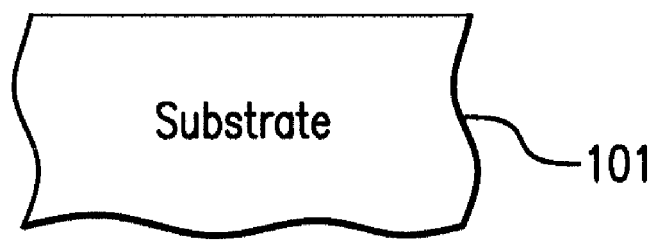
FIG. 1A is a partial cross-sectional view of a substrate used for fabrication of the solar cells, according to an embodiment of the invention.

FIG. 1A is a partial cross-sectional view illustrating a first step of a method for manufacturing a semiconductor-based solar cell, according to an embodiment of the present invention. A first substrate 101 is provided, which can be a semiconductor wafer, for example a GaAs wafer, or any other suitable growth substrate made of a semiconductor material, such as of Ge, InP or GaAs or of other suitable material.

Figure 1B:
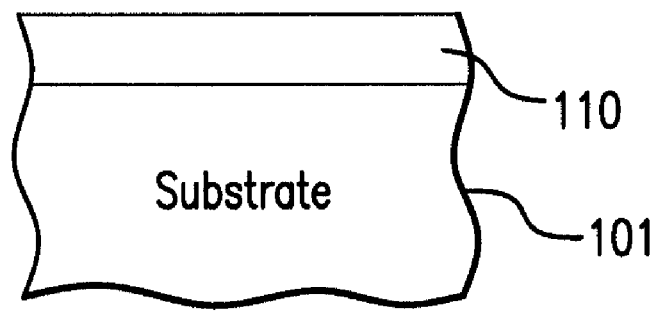
FIG. 1B is a cross-sectional view of the substrate after the deposition of semiconductor layers on the growth substrate.

With reference to FIG. 1B, a plurality of semiconductor layers are sequentially deposited on substrate 101, which are collectively indicated with referral number 110 and referred to as the semiconductor body. The semiconductor layers comprise for example binary, ternary and/or quaternary alloys of III-V semiconductors (details of the semiconductor layers are not illustrated in the figures). The plurality of semiconductor layers 110 will constitute the absorption portion of the cell, in which the absorption of the sun light takes place.

In a preferred embodiment, the solar cell is an inverted metamorphic multi-junction (IMM) cell comprising three sub-cells vertically stacked on the substrate. In manufacturing IMM cells, the direction of growth, which is typically an epitaxial growth, of the sub-cells is inverted.

The basic concept of fabricating an inverted solar cell (such as an inverted metamorphic solar cell) is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are initially grown epitaxially directly on a semiconductor growth substrate, such as for example GaAs or Ge, and such subcells are consequently lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e., a band gap in the range of 0.7 to 1.2 eV). A surrogate substrate or support structure is then attached or provided over the "bottom" or substantially lattice-mismatched lower subcell, and the growth semiconductor substrate is subsequently removed. The growth substrate may then subsequently be re-used for the growth of a second and subsequent solar cell.

Figure 1C:
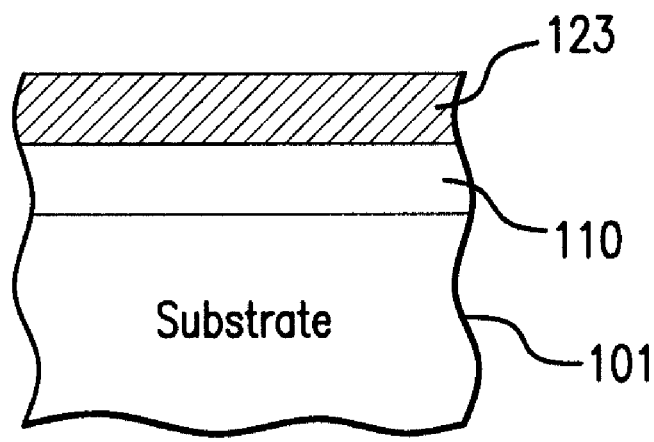
FIG. 1C is a cross-sectional view of the wafer of the invention after the deposition of a metal layer over the semiconductor layers.

With reference to FIG. 1C, the top subcell (subcells not shown in the figure) of the semiconductor body 110 is grown on substrate 101.

Following the deposition of the semiconductor body 110, a backside electrically conductive contact layer 123 is deposited on the semiconductor body (FIG. 1C). Preferably, the backside contact layer 123 is a metal layer, for instance a Ti/Au/Ag/Au sequence of layers. Thickness of the metal layer can be for instance of from 3 to 6 µm. As it will become clearer from the following description, at least one portion of the metal layer 123 will constitute the anode electrode of an individual solar cell.

Figure 2:
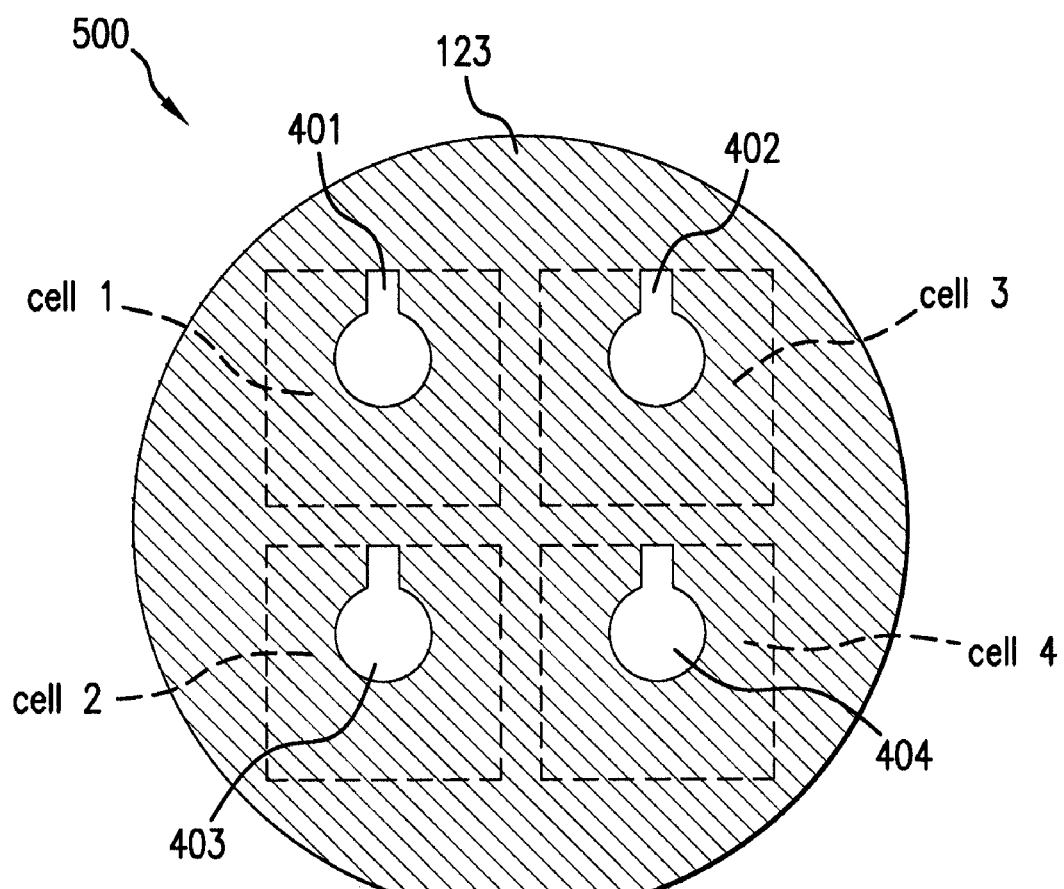
FIG. 2 is a top plan view of the layered structure of FIG. 1C after the next process step of patterning the metal layer by removing portions of the metal layer.

FIG. 2 is a top plan view of the layered structure 500 of FIG. 1C after the step of patterning of the metal layer 123. The metal layer 123 is patterned by using conventional photolithography and lift-off techniques so as to remove the metal layers from a plurality of regions, each region being comprised in a surface area of the semiconductor portion corresponding to an individual solar cell or a plurality of solar cells to be formed on the substrate 101 during the process steps described in the following.

Alternatively, the metal layer 123 can be deposited on the semiconductor body 110 after deposition and patterning of a photoresist so as to define the regions in which no metal should be present.

The plan view of FIG. 2 illustrates the top surface of the metal layer 123, which will constitute the backside contact layer for the anode contact of the integrated solar cell structure to be formed.

In general, as used herein, the terms "top" and "bottom", "above" and "below" are used in the context of relativity with respect to deposition direction of the layers on the substrate according to the illustrated embodiments of the invention or orientation of the substrate. Such positional terms may or may not refer to absolute positions. The terms "front side" and "backside" refer to the final arrangement of the integrated cell structure or of the individual solar cells with respect to the sun light incidence. It will also be understood that when a layer is referred to as being "on" another layer or substrate, it can be directly on the other layer or substrate or intervening layers may also be present.

The position of four solar cells (in dotted line outline) to be fabricated from the wafer are shown in FIG. 2. In correspondence with each individual cell 1, 2, 3, and 4, the metal layer 123 is removed from respective window regions 401, 402, 403, and 404 to expose the semiconductor body. It is to be understood that the number of individual solar cells depicted in FIG. 2 is for illustration purposes only, and the present invention is not limited to any specific number of cells per wafer.

In the illustrated embodiment, the regions free from the metal layer have approximately a keyhole shape with a circular region connected to a rectangular strip-shaped region. The present invention is however not limited to a particular shape of the window regions, which could for example be square or rectangular, although, preferably, the window regions 401, 402, 403, and 404 extend from an edge of the respective individual cells to be fabricated to a surface location within the individual cell surface area.

Figure 3A:
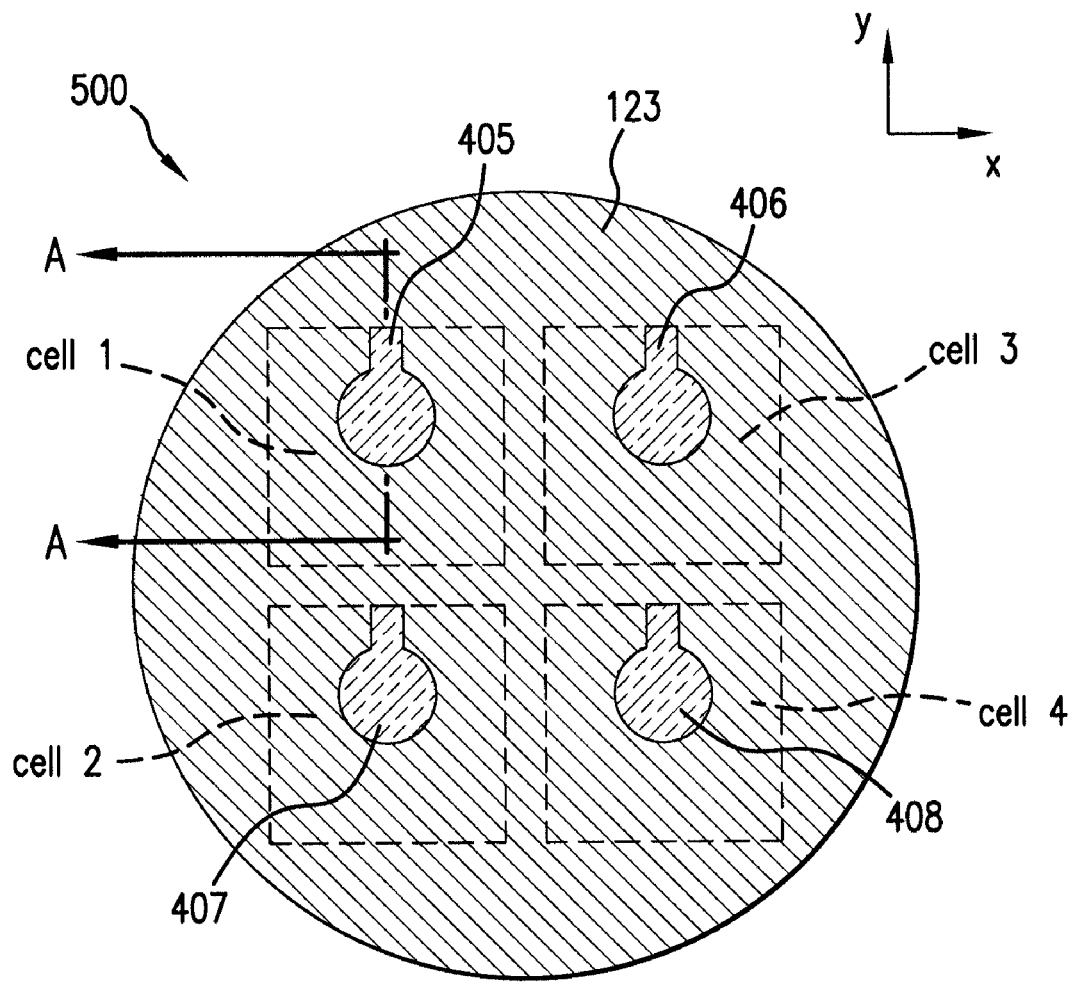
FIG. 3A is the top plan view of FIG. 2 after the next process step of deposition of an insulating layer on portions where there is no metalization.

In a next process step illustrated in FIG. 3A, a layer of electrically insulating material is deposited in correspondence with the window regions 401, 402, 403 and 404, where there is no metal layer 123. This can be performed for example by masking the whole top surface of metal layer 123 except the window regions and then depositing an insulating material. In this way, "islands" or pads 405, 406, 407, and 408 of electrically insulating material are formed within the respective window regions 401, 402, 403, and 404. The insulating material is preferably a dielectric layer, more preferably a polymeric dielectric layer, such as an SU-8 layer.

Figure 3B:
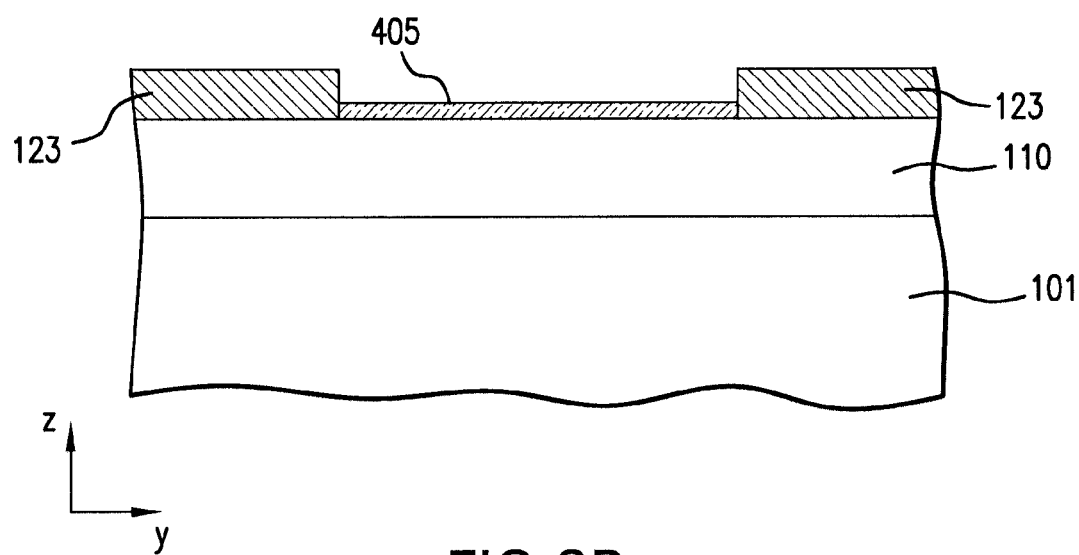
FIG. 3B is a cross-sectional view of the structure of FIG. 3A through the A-A plane shown in FIG. 3A.

FIG. 3B is a cross-sectional view of the structure of FIG. 3A through the A-A plane shown in FIG. 3A, within the surface area of "cell 1". The electrically insulating layer 405 has preferably a thickness smaller than that of the metal layer 123. For example, the thickness of dielectric layer 405 is of about 1 µm, while the thickness of metal layer 123 is of 5 µm. The dielectric layer has a first surface area in a plane parallel to the top surface of backside contact layer 123, i.e., plane (x,y), and a first outer perimeter edge, which corresponds to the outer perimeter edge of the window region 401 of FIG. 2.

Figure 4A:
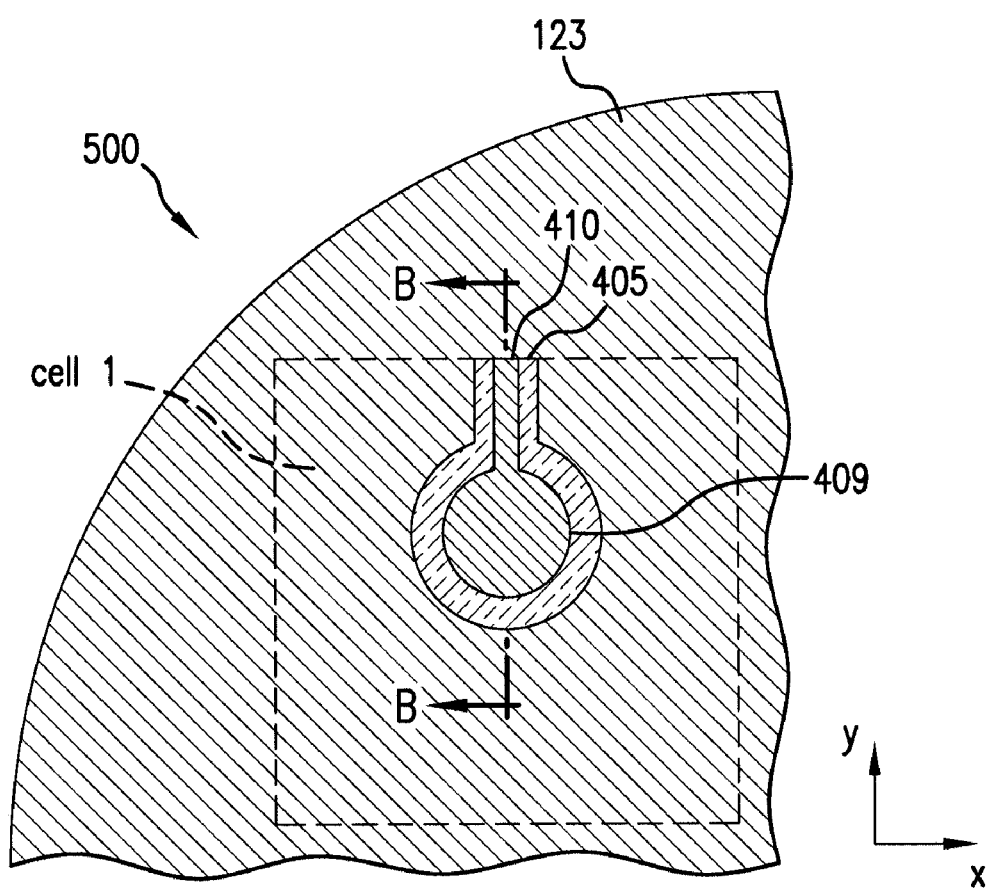
FIG. 4A is an enlarged portion of the plan view of FIG. 3A, corresponding to the region of "cell 1" after the next process step of depositing an electrically conductive pad.
Figure 4B:
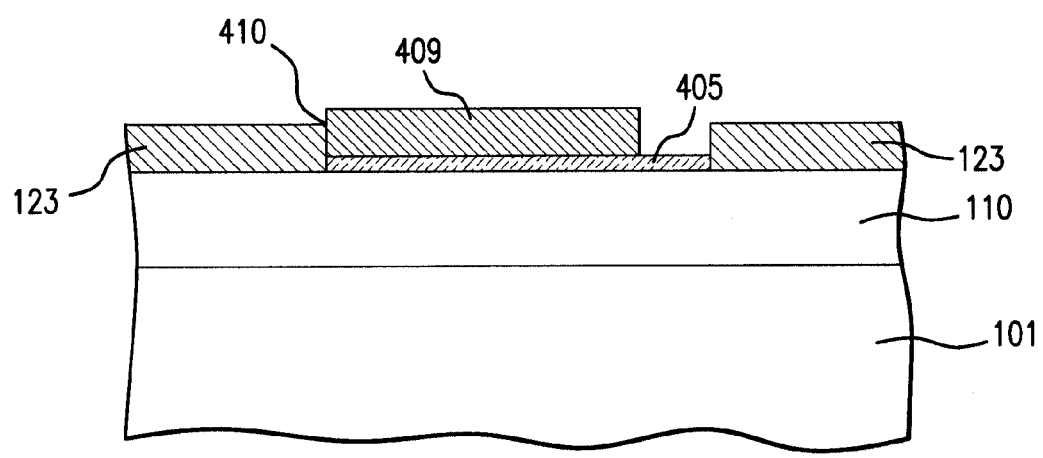
FIG. 4B is a cross-sectional view taken in the structure of FIG. 4A through the B-B plane shown in FIG. 4A.

FIG. 4A is an enlarged portion of plan view of FIG. 3A corresponding to the region of "cell 1", after the next process step. FIG. 4B is a cross-sectional view taken through the B-B plane of the structure of FIG. 4A. An electrically conductive pad 409 is formed on the dielectric layer 405, for example, by being deposited by evaporation following photolithography. The conductive pad 409 has a second surface area defined in the (x,y) plane, which is smaller than the first surface area of the dielectric island 405 so that the conductive pad lies inside the dielectric island in the (x,y) plane with a second outer perimeter edge smaller than the first perimeter edge. A peripheral region of the dielectric island 405 is thus defined around the second outer perimeter edge of the conductive pad, the peripheral region being not covered by the pad 409. The second outer perimeter edge has a first perimeter portion lying inside the first perimeter edge and a second perimeter portion 410 contacting the backside contact layer 123. In the embodiment of the figure, the second portion 410 of the second perimeter edge coincides with a perimeter portion of the first perimeter edge of the dielectric layer 405.

The electrical conductive pad 409 is preferably a metal layer, for instance a Ti/Au/Ag/Au sequence of layers.

It is noted that the manufacturing method of the illustrated embodiments preferably comprises the step of removing the metal layer 123 from window regions 401-404 (FIG. 2), since it allows to form a conductive pad that is partially electrically isolated from the surrounding backside metal layer 123 and, provided that the thickness of the dielectric layer is smaller than the thickness of the backside metal layer, to have a total height of the conductive pad 409 and the electrically insulating layer 405 substantially equal to or slightly larger than that of the metal layer 123. In the embodiment shown in FIG. 4B, the metal pad 409 slightly vertically protrudes from the top surface of the metal layer 123, e.g., of 5 μm. However, in some embodiments, the manufacturing process does not include the step of formation of window regions exposing the semiconductor body, and islands of dielectric material are deposited on top of layer 123.

After the step illustrated in FIGS. 4A and 4B, a conductive pad 409, which is electrically isolated from a first portion of the backside contact layer 123, is realized. The first portion of the backside contact layer 123 will form the anode electrode or anode contact.

Figure 5:
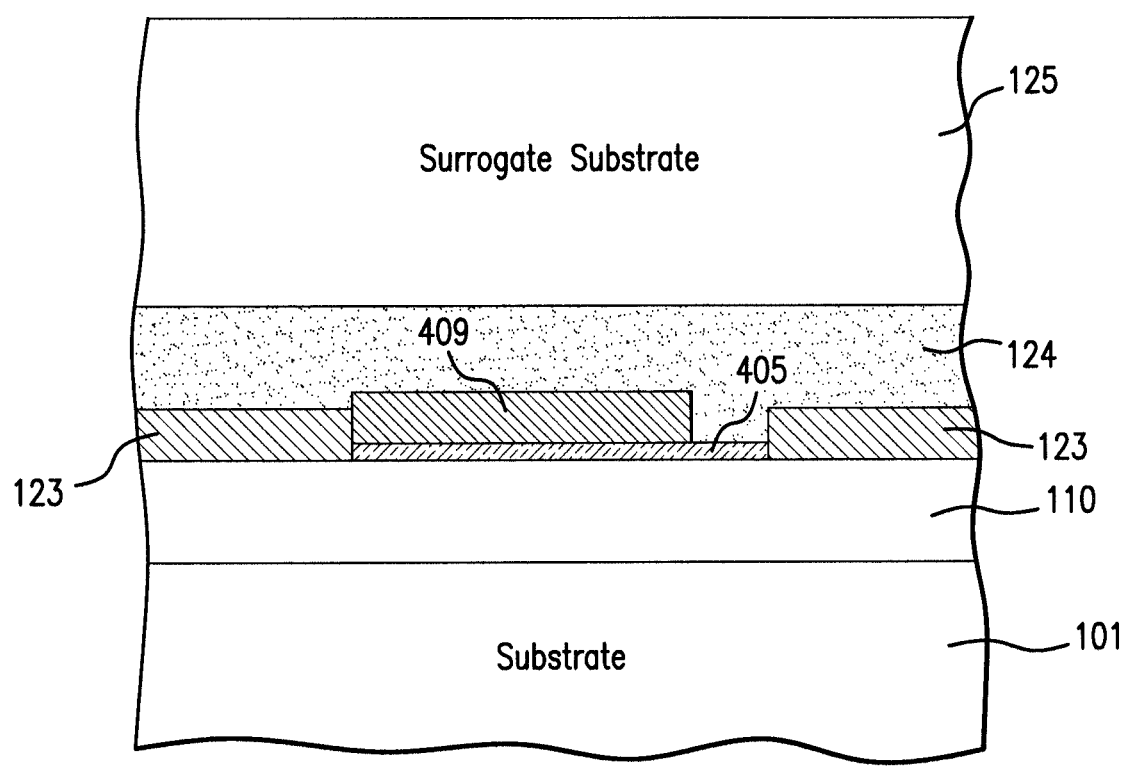
FIG. 5 is a cross-sectional view of a portion of the layered structure of FIG. 4B after the next process step in which a surrogate substrate is attached to the wafer.

The next step shown in FIG. 5 is the attachment of a second substrate to the layered structure of FIG. 4B. In particular, a wafer carrier or surrogate substrate 125, for example a sapphire substrate with holes, is bonded to the top side of the layered structure by depositing an adhesive layer 124, for example a silicone or thermoplastic adhesive, on the metalized surface of the layered structure.

Figure 6A:
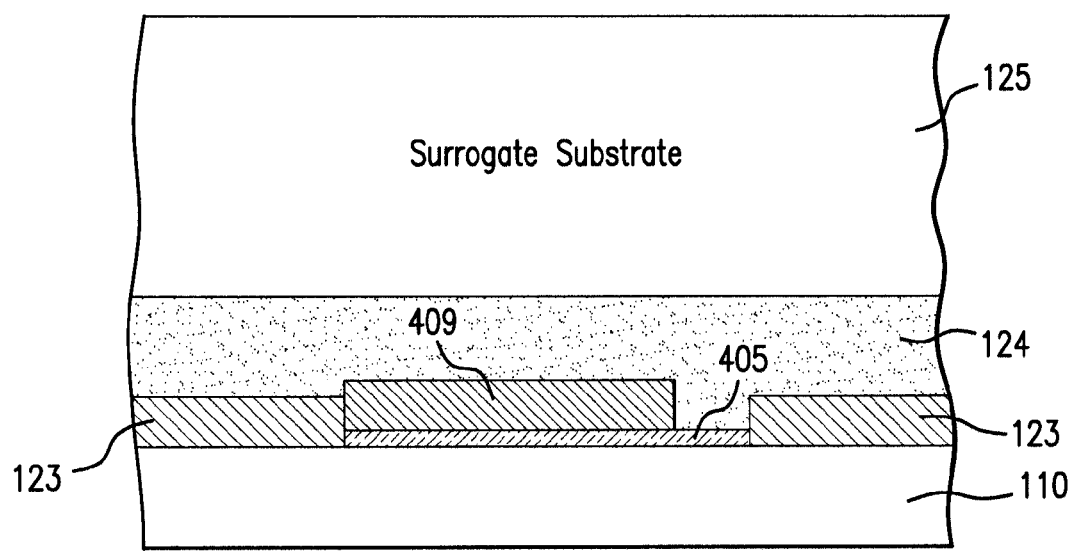
FIG. 6A is a cross-sectional view of a portion of the layered structure of FIG. 5 after the next process step in which the original substrate is removed.

The first substrate 101 is removed in the next process step shown in FIG. 6A, so as to expose the semiconductor body 110, and in particular to expose the first semiconductor layer previously deposited on the first substrate, now removed. This step can be performed for example by lapping or grinding down the substrate from its bottom surface.

Figure 6B:
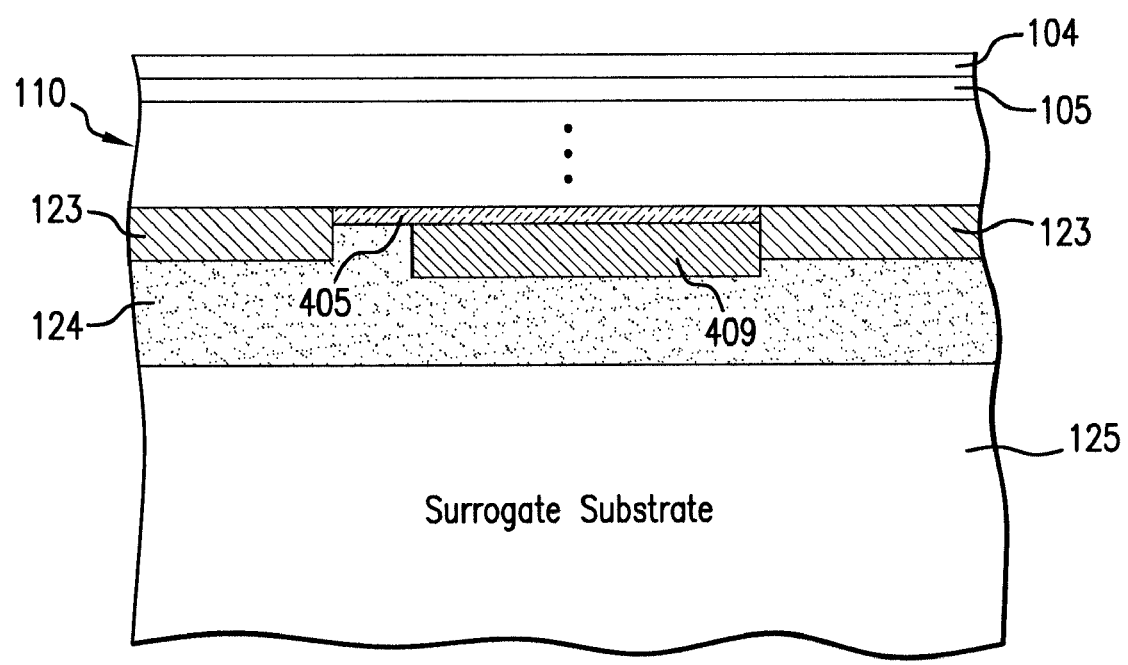
FIG. 6B is another cross-sectional view of a portion of the layered structure of FIG. 5, similar to that of FIG. 6A, but here oriented and depicted with the surrogate substrate at the bottom of the figure.

The layered structure with the attached surrogate second substrate is then turned upside-down so as to position the semiconductor body 110 on the top side and the surrogate substrate 125 on the bottom, as shown in FIG. 6B. In the figure, the two uppermost semiconductor layers 104 and 105 of the semiconductor body 110 are indicated. Semiconductor layer 104, placed on top of layer 105, is the first deposited semiconductor layer and is a contact layer, preferably made of a heavily doped semiconductor material, for example $n^+$-GaAs. Semiconductor layer 105 is a window layer, for example $n^+$-InAlP$_2$, of the top sub-cell of a vertically stacked triple-junction IMM cell.

Figure 7:
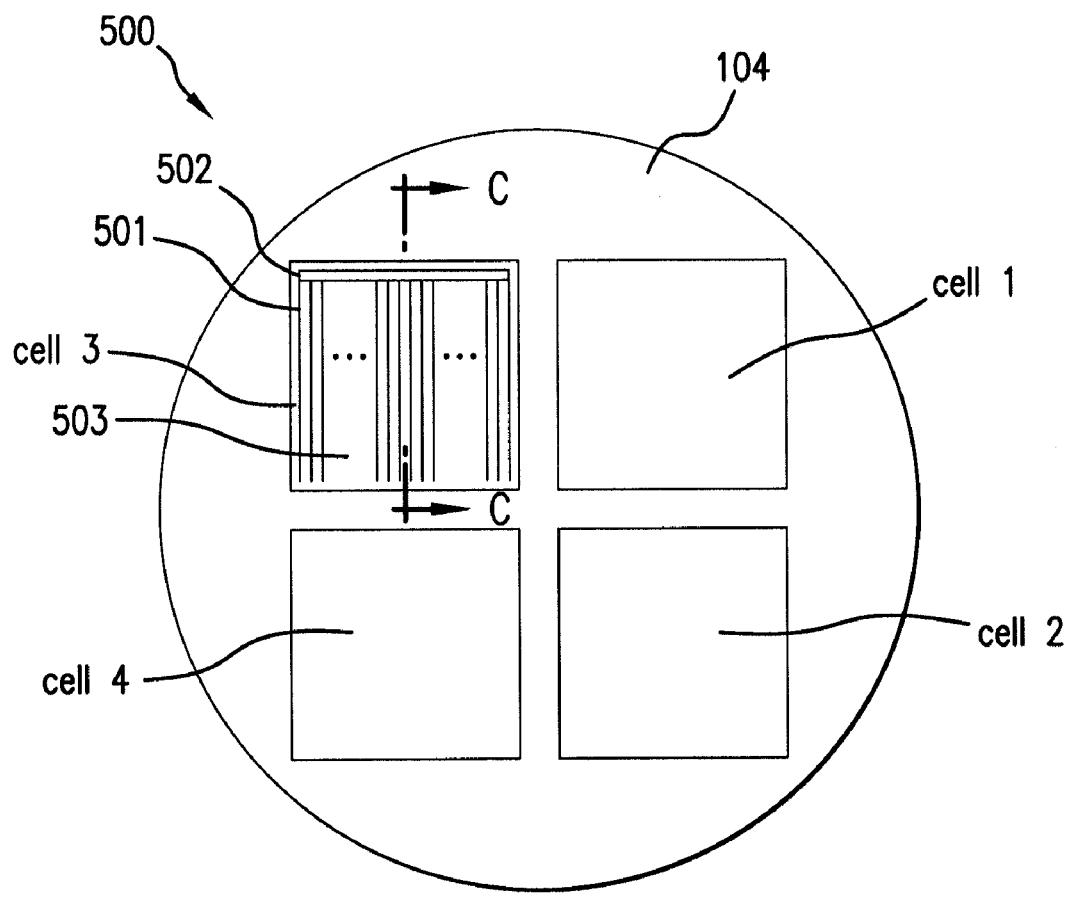
FIG. 7 is a top plan view of the layered structure of FIG. 6B after the next process step of forming a front electrode on the cell and depicting the four cells.
Figure 8:
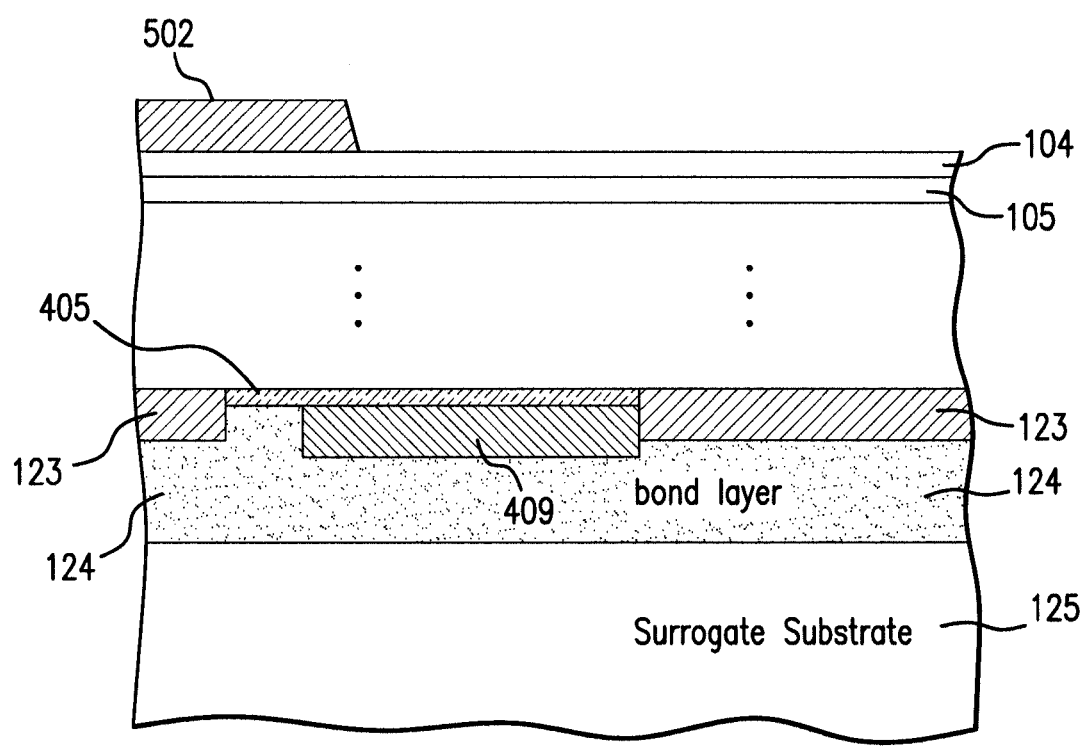
FIG. 8 is a cross-sectional view of the layered structure of FIG. 7 through the C-C plane of FIG. 7.

FIG. 7 is a top plan view of the layered structure of FIG. 6B in which the position of four cells is depicted with dashed line, after the next process step of forming a front cathode contact on each cell. FIG. 8 is a cross-sectional view through the C-C plane of FIG. 7. A front cathode contact is formed comprising a plurality of parallel grid lines 501 connected to an interconnecting bus bar 502 arranged within the surface area of each cell along a peripheral edge (for simplicity, the front cathode contact of only cell 4 is shown). Grid lines 501 and bus bar 502 can be formed by deposition of a metal layer on the top surface of the semiconductor body 110 via evaporation and patterning by photolithography by using a mask that is subsequently lifted off. In an embodiment, the interconnecting bus bar 502 and grid lines 501 deposited on top of the contact layer 104 are made of Pd/Ge/Ti/Pd/Au sequence of layers, although other suitable electrically conductive material can be used.

Figure 9:
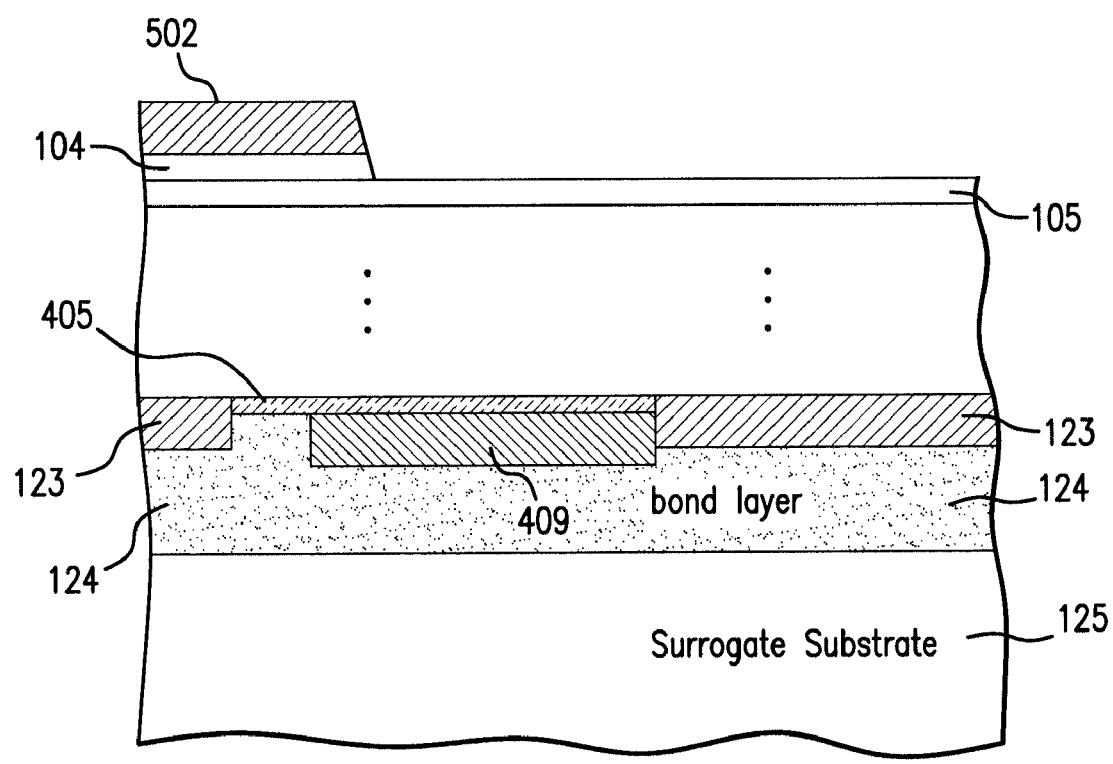
FIG. 9 is a cross-sectional view of the layered structure of FIG. 8 after the next process step.

In the next process step, illustrated in FIG. 9, the interconnecting bus bar 502 and the grid lines 501 of the front electrode are used as mask for etching away the semiconductor contact layer 104 down to the semiconductor window layer 105 from the exposed regions of the contact layer. Wet etching can be used to etch away the contact layer, for example by employing a citric acid/peroxide etching mixture.

Figure 10:
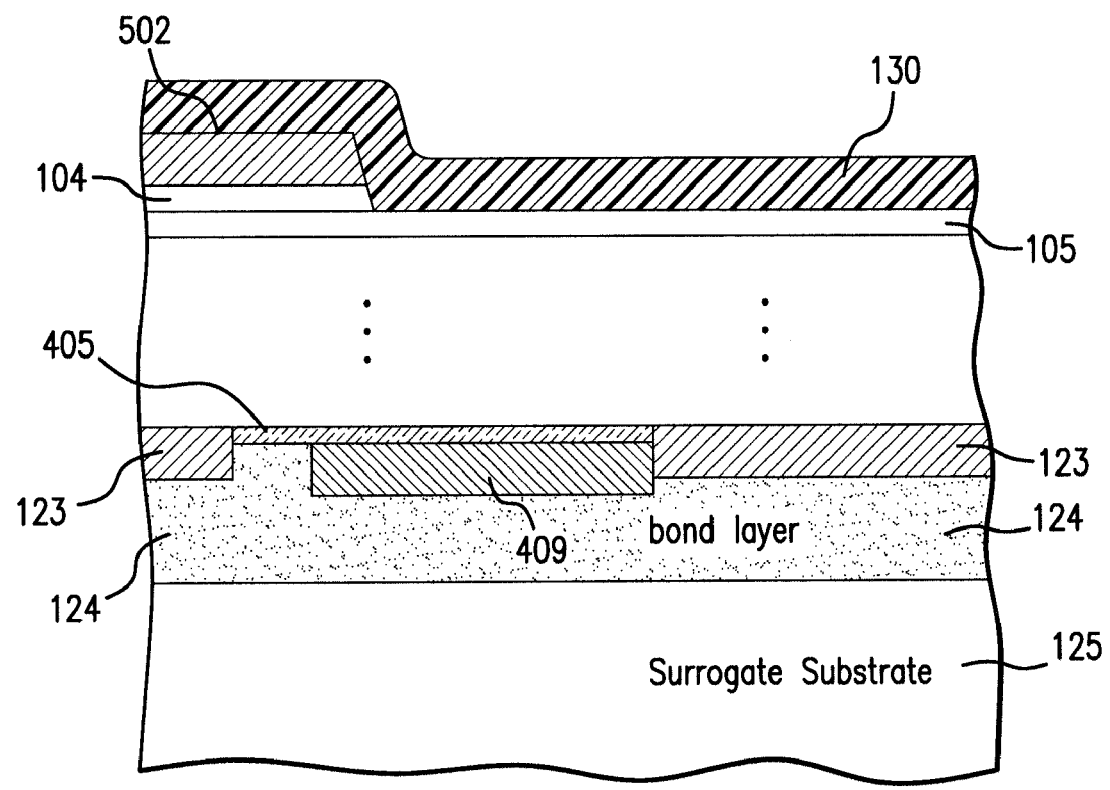
FIG. 10 is a cross-sectional view of the portion of the layered structure of FIG. 9 after the next process step.

An anti-reflection coating (ARC) layer 130 is subsequently deposited over the entire top surface of the layered structure, as shown in FIG. 10.

Figure 11:
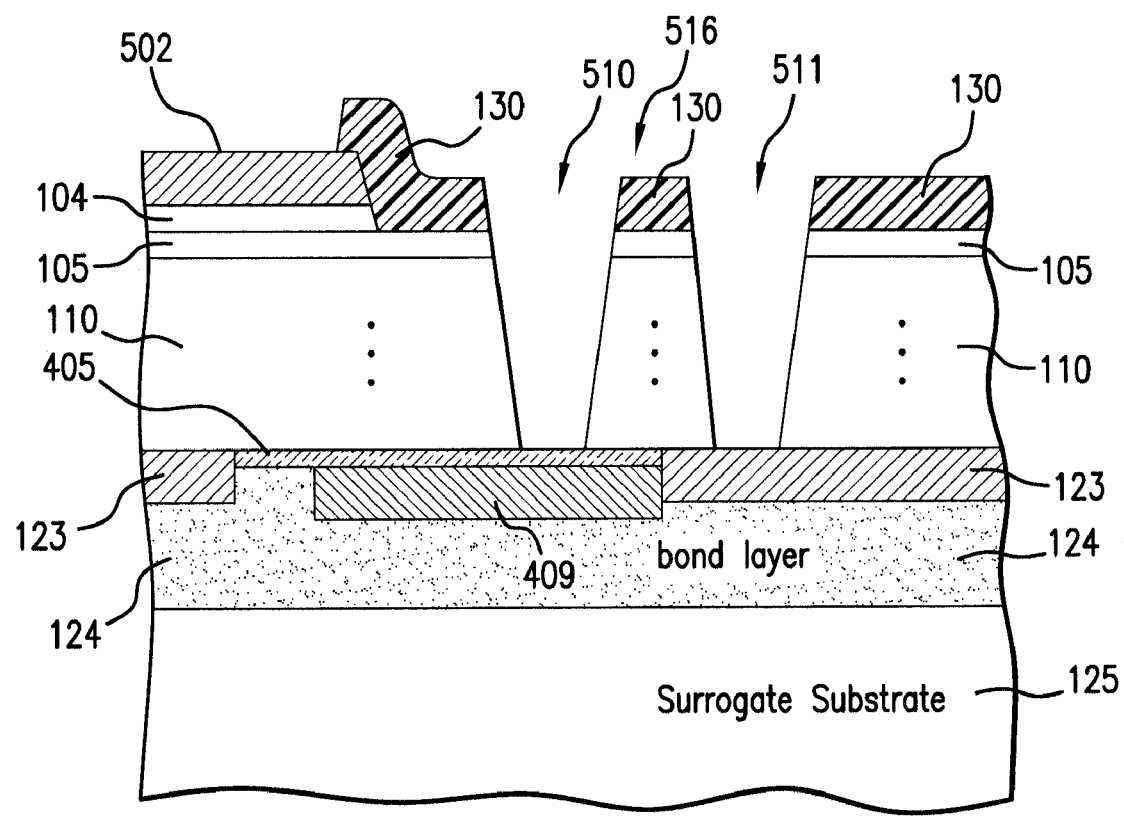
FIG. 11 is a cross-sectional view of the portion of the structure of FIG. 10 after the next process step in which solar cells are defined by etching mesa structures.

In the next process step, shown in FIG. 11, individual solar cells are defined by etching mesa structures through the semiconductor body 110. By selective etching, a first annular trench 510 is opened by etching away the semiconductor body in lateral regions so as to define a peripheral boundary of an individual solar cell provided with the front cathode contact, the backside anode contact (i.e., first portion of backside contact layer 123) and a back cathode contact isolated from the anode contact. The first trench 510 has inner sidewalls delimiting the active portion of a cell formed as a first mesa structure. One side of the first trench 510 is opened in a lateral region corresponding to the location of the dielectric island 405 to expose at least a portion of the latter on the bottom surface of the first trench. Subsequently, or preferably simultaneously (i.e. by means of the same chemical etching process), a second annular trench 511, surrounding the first annular trench 510, is opened to expose the backside contact layer 123. Wet or dry chemical etching is used to etch away the semiconductor layers to form the first and second trenches. For instance, a wet chemical etching is used, which substantially etches or attacks neither the metal nor the dielectric material of layer 405.

The lateral region extending from the inner sidewalls of the first trench will be referred to as the peripheral lateral region.

The first trench 510 defines a peripheral boundary of an individual solar cell, while second trench 511 is located in the lateral peripheral region of the cell defining the boundary between the cell integrated structure and the remaining cells formed on the surrogate substrate. In particular, the second trench 511 is a dice street where the die containing the individual solar cell is diced from the wafer or from the substrate mounting the remaining cells. By etching first and second trenches a peripheral second mesa structure 516 is formed having inner sidewalls facing the sidewalls of the cell's mesa structure in the first trench and outer sidewalls in the second trench.

First and second trenches, which encircle the active portion of the individual cells, can be square shaped, as in the embodiments shown in the figures, or may have other shapes, such as a rectangular or ring shape.

Figure 12:
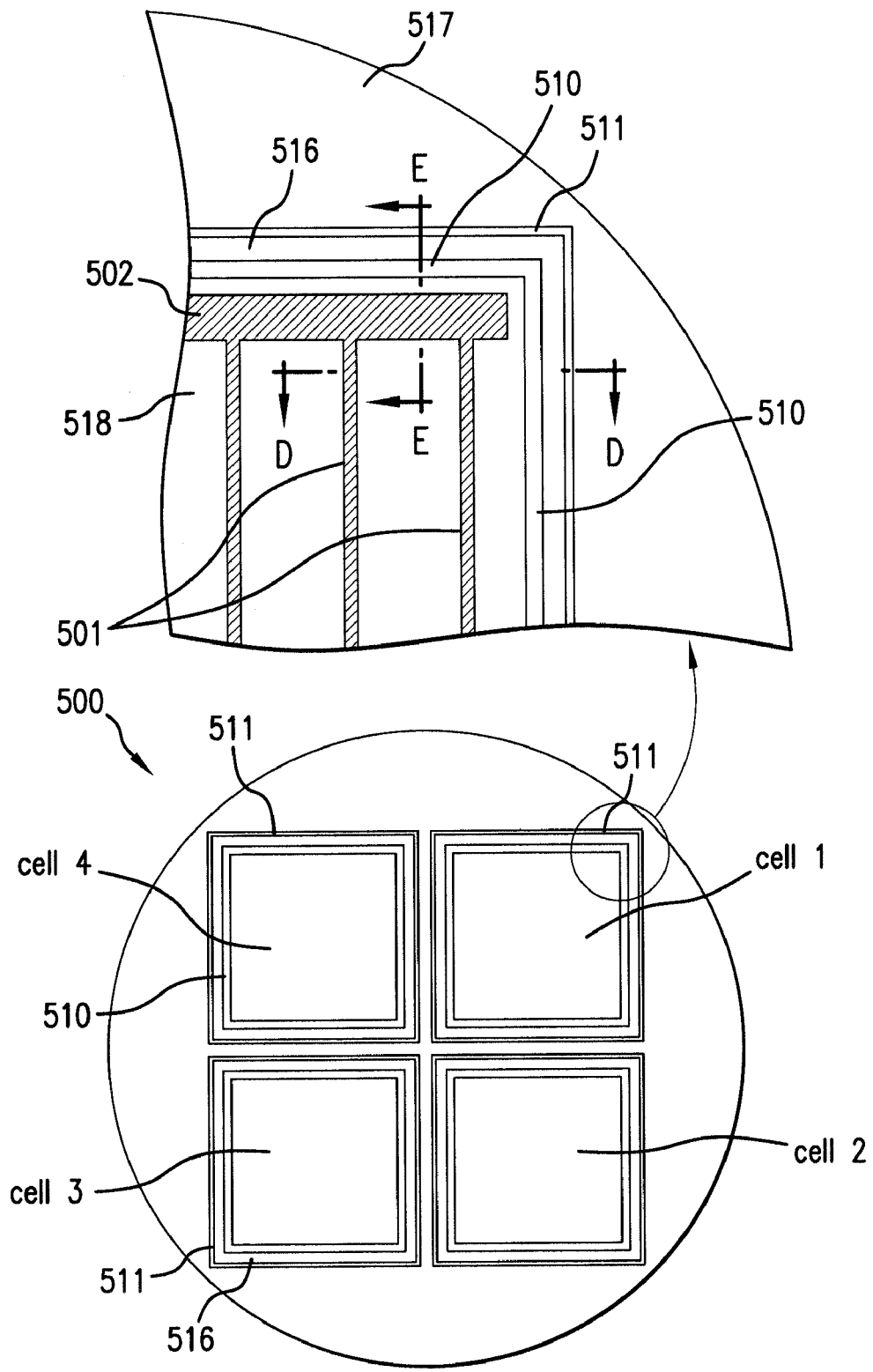
FIG. 12 is a top plan view of the layered structure of FIG. 11 depicting the surface view of the trenches etched around each of the solar cells, after the process step depicted in FIG. 11, together with an enlarged view of a portion of the corner of one of the cells.
Figure 13:
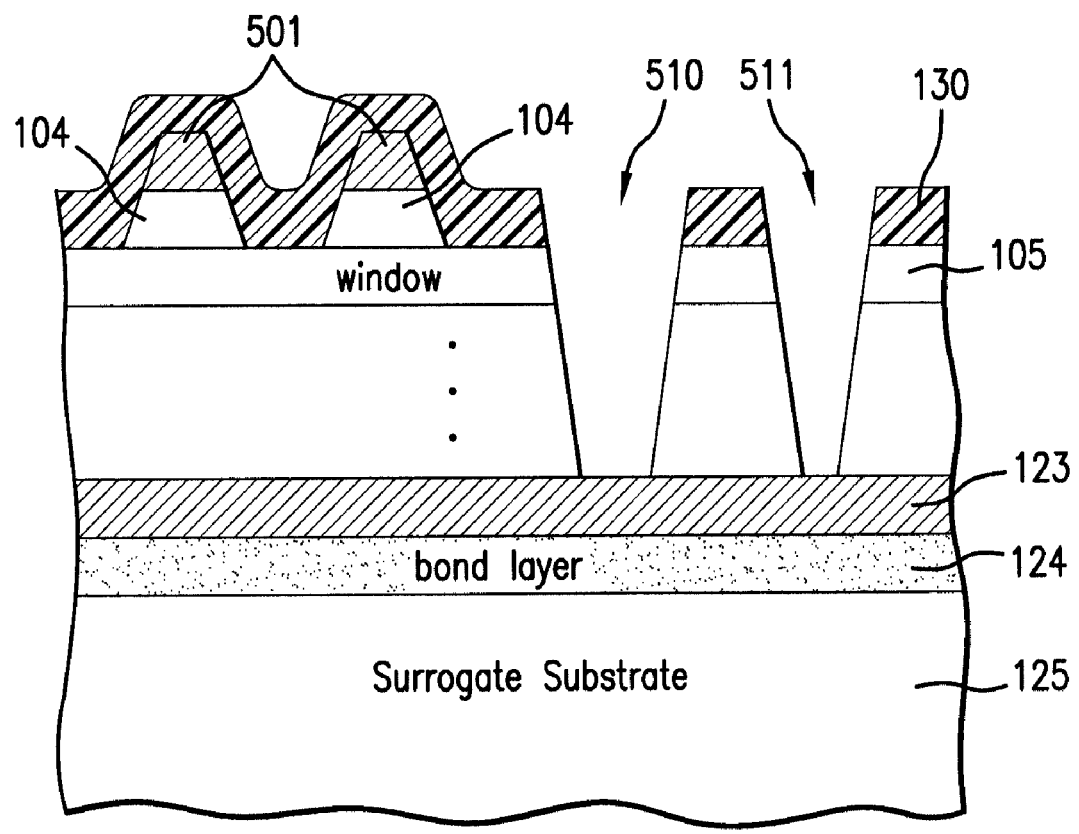
FIG. 13 is a cross-sectional view through the D-D plane of FIG. 12, depicting the trenches and two of the grid lines.

FIG. 12 is a simplified top plan view of the layered structure at the process step illustrated in FIG. 11 depicting the surface view of the annular trenches etched around each of the solar cells, together with an enlarged view of a portion of the corner of one of the cells (cell 1). To improve clarity, front cathode contact is only shown in the enlarged portion of FIG. 12 and the ARC layer 130 on top of the grid lines 501 is not shown. FIG. 13 is a cross-sectional view through the D-D plane of FIG. 12, depicting first and second trenches and two of the grid lines covered by the ARC layer. Preferably, the bottom of the first trench 510 has a width larger than the width of the bottom of the second trench 511.

Referring back to FIG. 11, the selective etching also removes portions of the ARC layer 130 to uncover the bus bar 502 of the front electrode (front cathode contact) for electrical contact to be brought to the backside of the solar cell.

Figure 14:
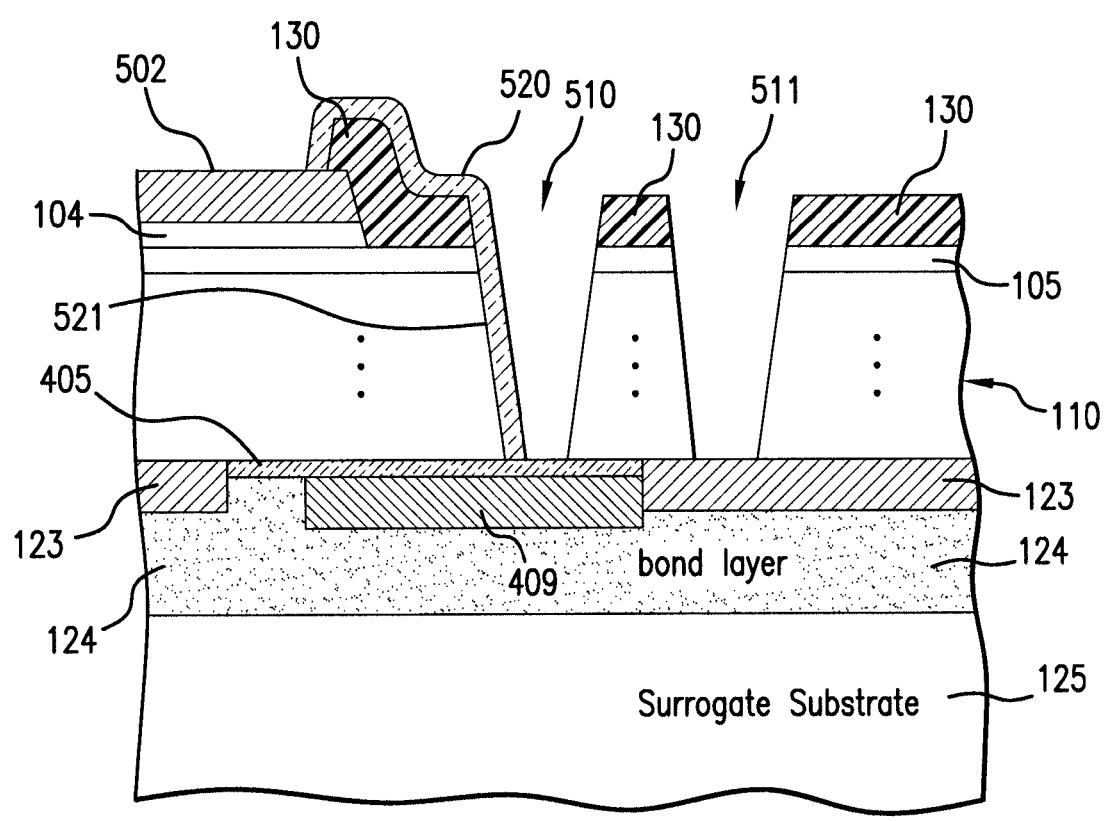
FIG. 14 is a cross-sectional view of the portion of the layered structure of FIG. 12 through the E-E plane depicting the trenches after the next process step in which an electrically insulating layer is formed along the sidewall of the first trench.

FIG. 14 is a cross-sectional view of the portion of the layered structure of FIG. 11 through the E-E plane of FIG. 12, after the next process step of depositing an electrically insulating layer on a sidewall of the cell's mesa structure. An electrically insulating layer 520, preferably a polymeric layer, for example SU-8, is deposited along the sidewall 521 of the mesa structure provided with the front contact (solar cell 1), the side wall being defined by the first trench 510. The polymeric layer 520 extends down to the bottom of the trench to connect to the dielectric island 405. Preferably, the polymeric layer 520 extends further from the shoulder of the sidewall 521 along a portion of the front surface of the cell overlaying the ARC layer 130 to contact the bus bar 502. In another embodiment, the polymeric layer 520 extends from the sidewall 521 along a portion of the top surface of the cell, however without contacting or overlaying the bus bar 502 (embodiment not shown in the figures).

Figure 15:
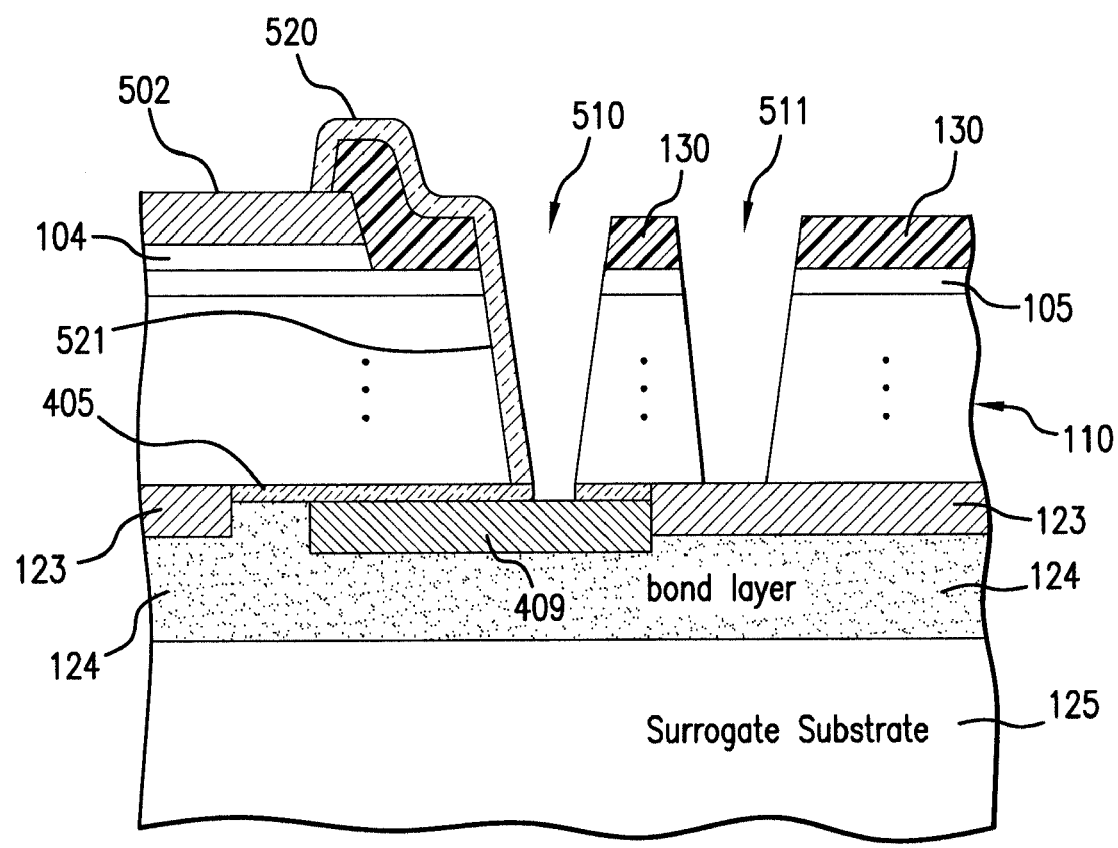
FIG. 15 is a cross-sectional view of the layered structure of FIG. 14 after the next process step in which the electrically insulating layer is removed from the bottom of the first trench.

In the next process step, shown in FIG. 15, the dielectric island 405 is removed from the bottom of the first trench 510 to expose a pad portion of the conductive pad 409 on the bottom surface of the first trench.

Figure 16:
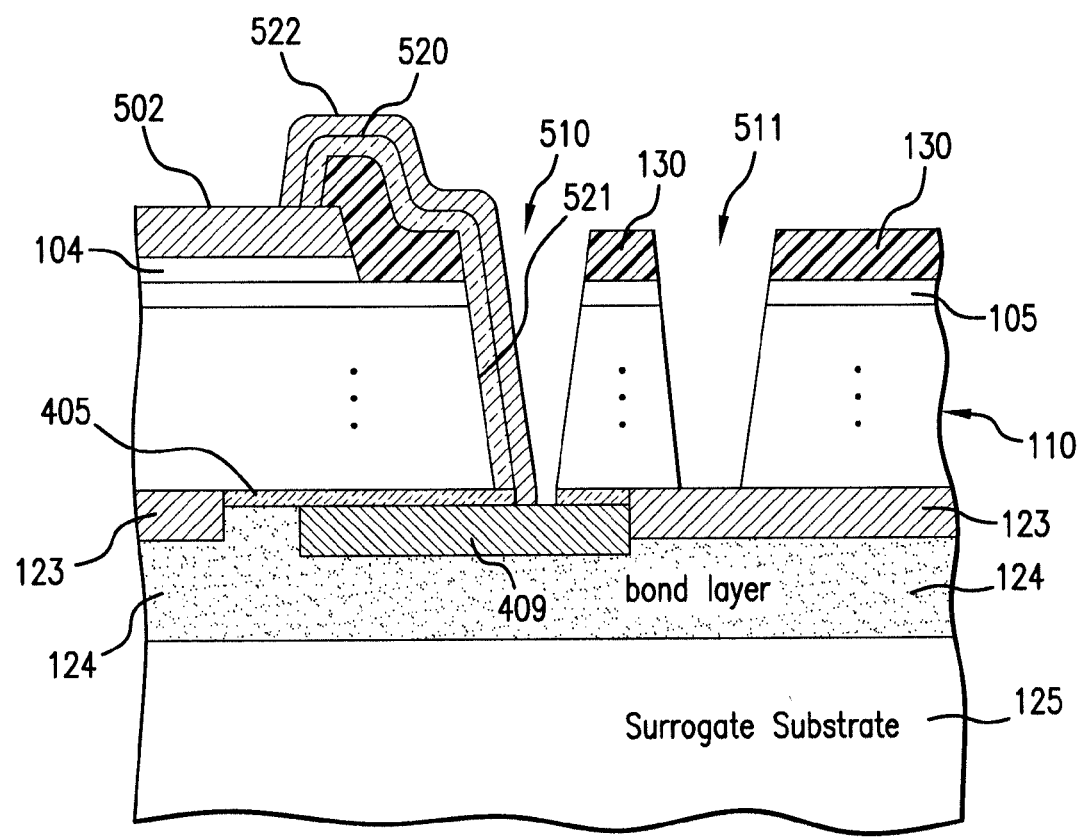
FIG. 16 is a cross-sectional view of the layered structure of FIG. 15 after the next process step in which an electrically conductive layer is formed over the electrically insulating layer along a sidewall of the first trench.

The next process step, shown in FIG. 16, is a deposition of an electrically conductive layer 522 over the dielectric layer 520 along the sidewall 521 down to the trench bottom and on a portion of the front surface of the cell mesa that extends from the mesa shoulder to the bus bar 502. For example, a sequence of layers made of Ti/Au/Ag/Au is evaporated through a photolithographic mask that is then removed. The layer 522 serves as "wrap-through" conductive path from the front cathode, i.e., from interconnecting bus bar 502, to the backside of the solar cell, and in particular to the exposed pad portion of the conductive pad 409, the conductive pad serving as back cathode electrical contact. Therefore, after this process step, the front electrode is brought to the backside of the solar cell while preventing from short circuiting or shunting the opposite polarity electrodes of the same cell to each other, because of the presence of the electrically insulating layer 405 that covers a portion of the backside of the cell's active portion. The electrically insulating layer 405 electrically isolates the back cathode electrical contact 409 from the portion of layer 123 that will constitute the backside anode contact. Advantageously, the cell's semiconductor layers are electrically insulated from the conductive layer by the presence of the insulating layer 520 covering the first trench's sidewall and joining the insulation layer 405.

With the present design, anode and cathode terminals can be accessed from the back side of the solar cells thereby allowing co-planar interconnection of the cells in a solar cell array.

Advantageously, the conductive path that serves as a wrap-through contact for the solar cell is formed in an "existing" via realized for the definition of the active area of an individual cell, and thus no additional etching of the semiconductor body is performed for the formation of a via or through-hole for the wrap-through contact.

The first trench surrounding the active area of the solar cell can be relatively wide, for example the width of the trench's bottom can be of nominally 75 µm and thus standard lithographic techniques can be used for the definition of the front-to-back conductive path.

Preferably, the electrically insulating layers for isolating the semiconductor body and the two electrodes from one another are made of an organic dielectric material, for example of SU-8. Advantageously, organic dielectric materials can be deposited by using spin-on techniques and then patterned by photolithography.

In the following, the next process steps will be described in which fabrication of the solar cells is completed, according to some embodiments of the present invention.

Figure 17:
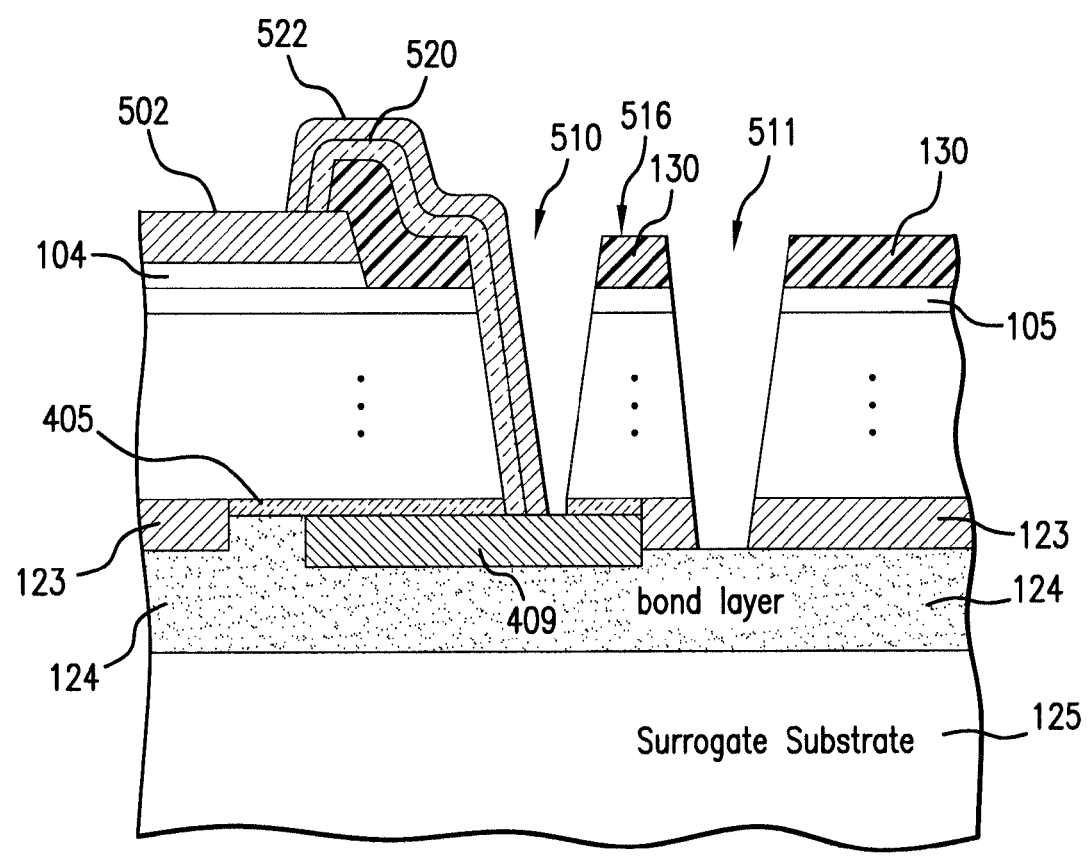
FIG. 17 is a cross-sectional view of the layered structure of FIG. 16 after the next process step in which the metal layer is removed from the bottom of the second trench.

In a next process step, shown in FIG. 17, the second annular trench 511 is exposed to a metal etchant to remove metal layer 123 from the trench so as to substantially uncover the adhesive layer 124 on the trench bottom. It is noted that this step can be carried out, alternatively, before the formation of the conductive path in the first trench.

Figure 18:
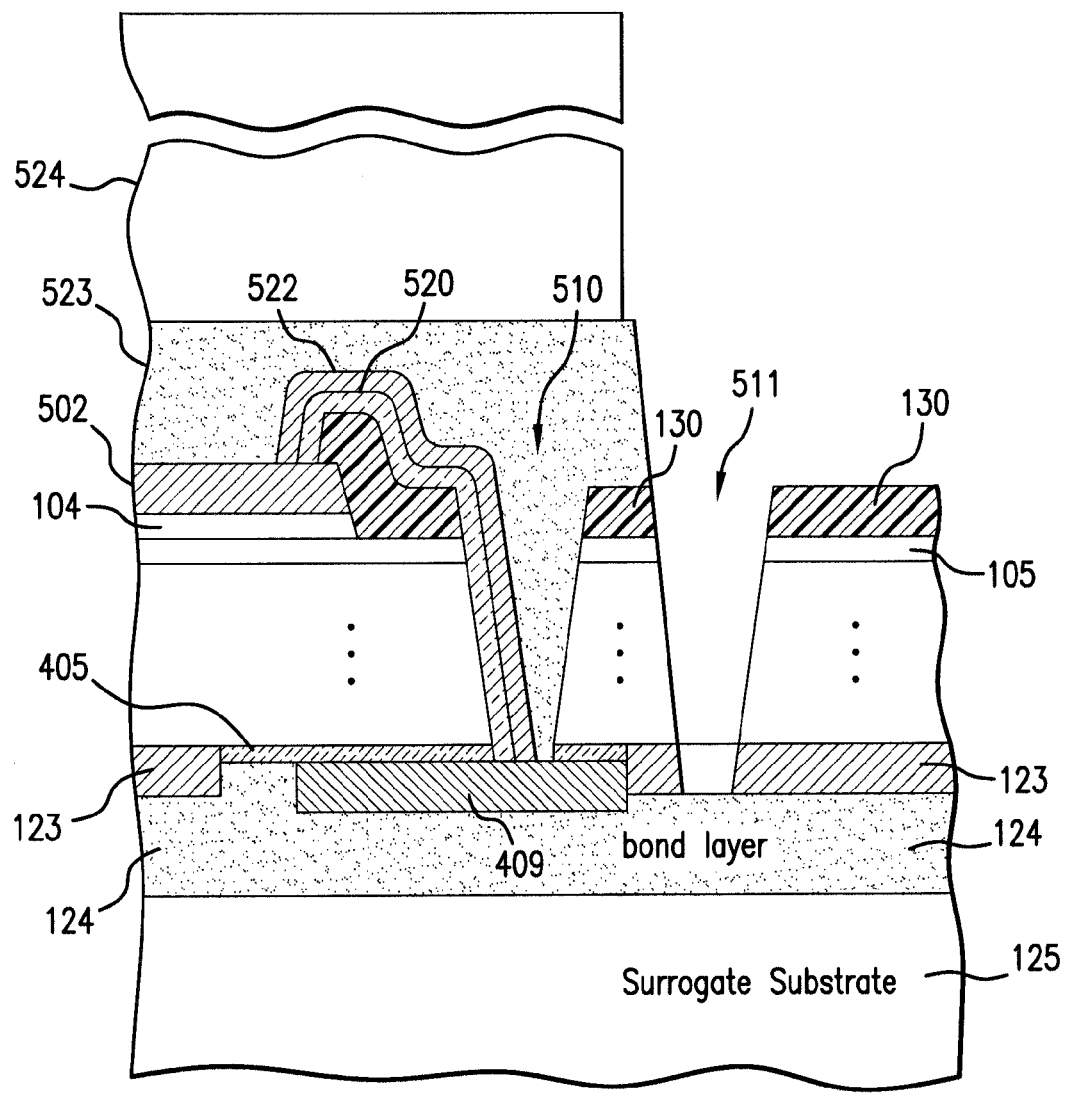
FIG. 18 is a cross-sectional view of the layered structure of FIG. 17 after the next process step of attaching on the front side of the solar cell a coverglass.

FIG. 18 is a cross-sectional view of the solar cell integrated structure of FIG. 17, after the next process step of attaching on the front side of the solar cell a coverglass. In particular, a coverglass 524 is secured on the front side of the cell by means of an adhesive layer 523, for example a silicone DC 93-500 layer, covering the top surface of the cell receiving the solar radiation, i.e., cell's mesa structure with front cathode and backside anode contacts and preferably filling the first trench 510. The coverglass 524 preferably covers the front side of the cell including the first trench 510, but does not extend above the second trench 511. To this end, it is preferred that the adhesive layer 523 is deposited over the front side of the cell up to the outer edge of the peripheral mesa structure 516 defining the outer sidewall for trench 511.

Figure 19:
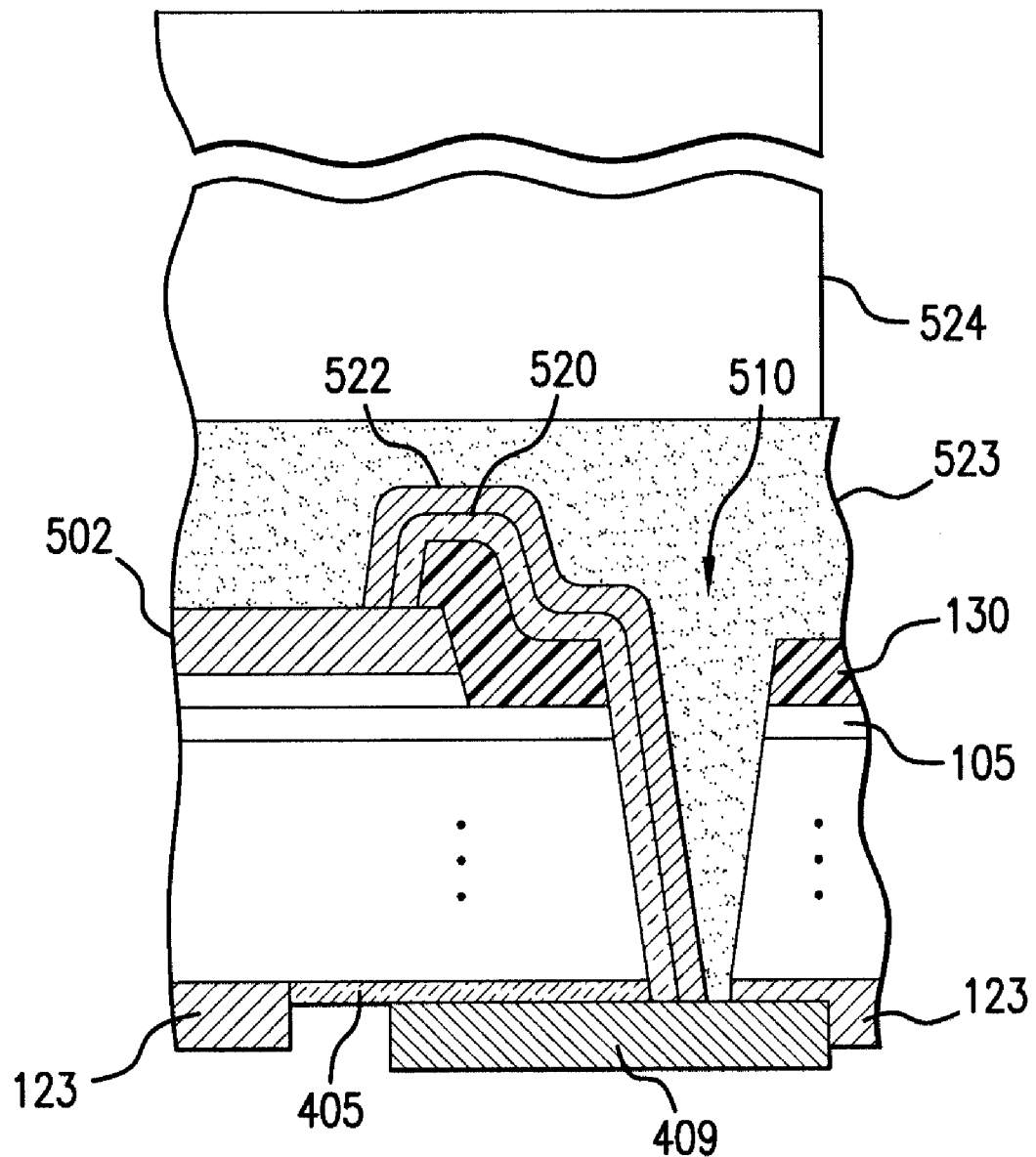
FIG. 19 is a cross-sectional view of the layered structure of FIG. 18 after the next process step of removing the surrogate substrate.

In a next process step, illustrated in FIG. 19, the surrogate substrate 125 and the adhesive layer 124 are entirely removed, dicing the solar cell along the second trench 511 that serves as dicing street from the remaining cells previously attached to the surrogate substrate. For explanation purposes only and with reference to FIG. 12, removal of the surrogate substrate and adhesive layer after the second trench 511 is etched into the metal layer 123 will detach the individual cells 1 to 4 from one another. In the individual solar cell of FIG. 19, the first trench 510 is both a via that defines the solar cell active portion and via for bringing the front cathode contact to the backside of the cell.

The surrogate substrate may be reused in further processing operations.

Referring again to FIG. 19, the solar cell is left with the coverglass 524 on the top and the contact layers on the backside of the cell. The front electrode (cathode) is accessed from the cell's backside through contact pad 409, whereas the portion of layer 123 in correspondence to the diced cell constitutes the anode electrode. Anode and cathode electrodes are electrically isolated one from another by means of the insulation island 405.

Figure 20:
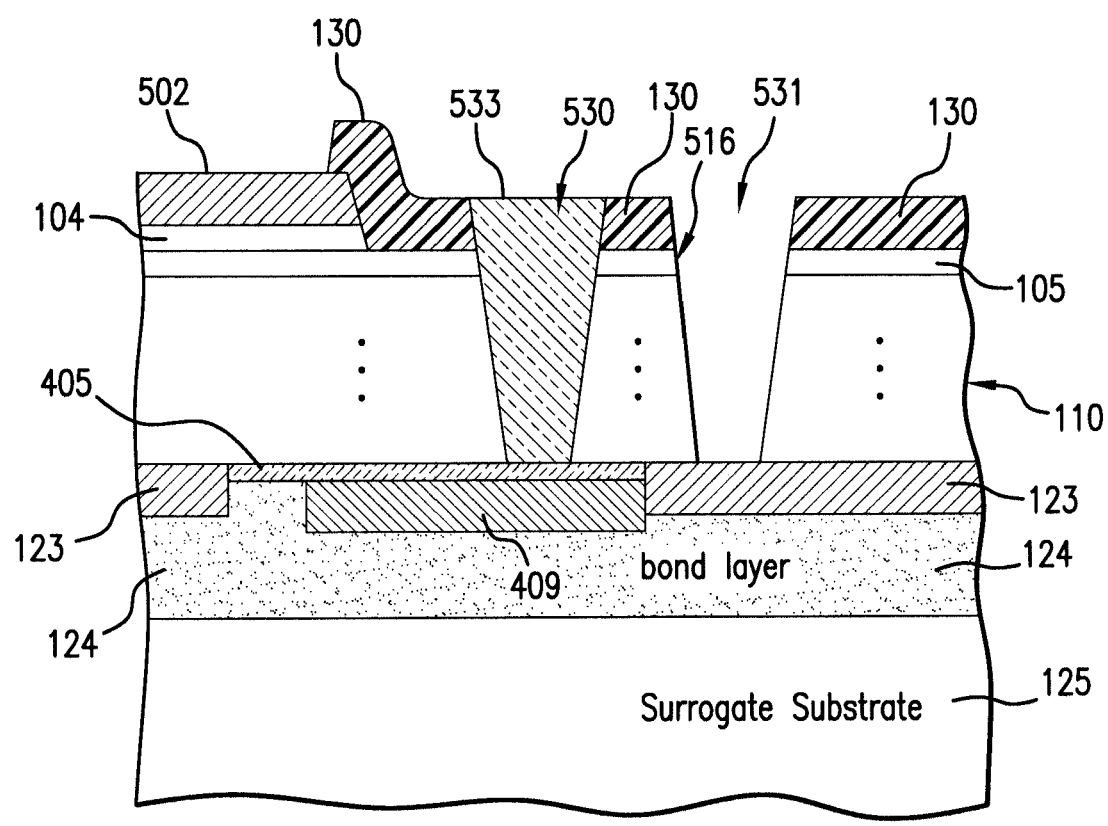
FIG. 20 is a cross-sectional view of the layered structure of FIG. 11 after the next process step in which the internal trench is filled with an electrically insulating material, according to another embodiment of the present invention.

According to a further embodiment of the present invention, a wrap-through contact is formed in the second trench 511 (dicing street), instead of in the first trench. In this embodiment, process steps can be the same as those described with reference to FIGS. 1 to 13. FIG. 20 illustrates a process step next to the step described with reference to FIG. 11, in which individual solar cells are defined by etching mesa structures through the semiconductor layers 110. By selective etching, a first annular trench 530 enclosing the active area of an individual cell is opened to expose the dielectric layer 405 and a second annular trench 531, surrounding the first annular trench 530, is also opened to expose the backside contact layer 123. In an embodiment (not shown in the figures) the second trench 531 can be opened in correspondence to the cross-sectional edge of the dielectric layer 405 so that the insulating layer extends laterally to outer edge of the peripheral mesa 516.

During the process step illustrated in FIG. 20, the first trench 530 is filled with an electrically insulating material 533, which is preferably a polymeric material. In this way, the sidewalls of the semiconductor body 110 of the mesa structure of the cell are electrically insulated.

Figure 21:
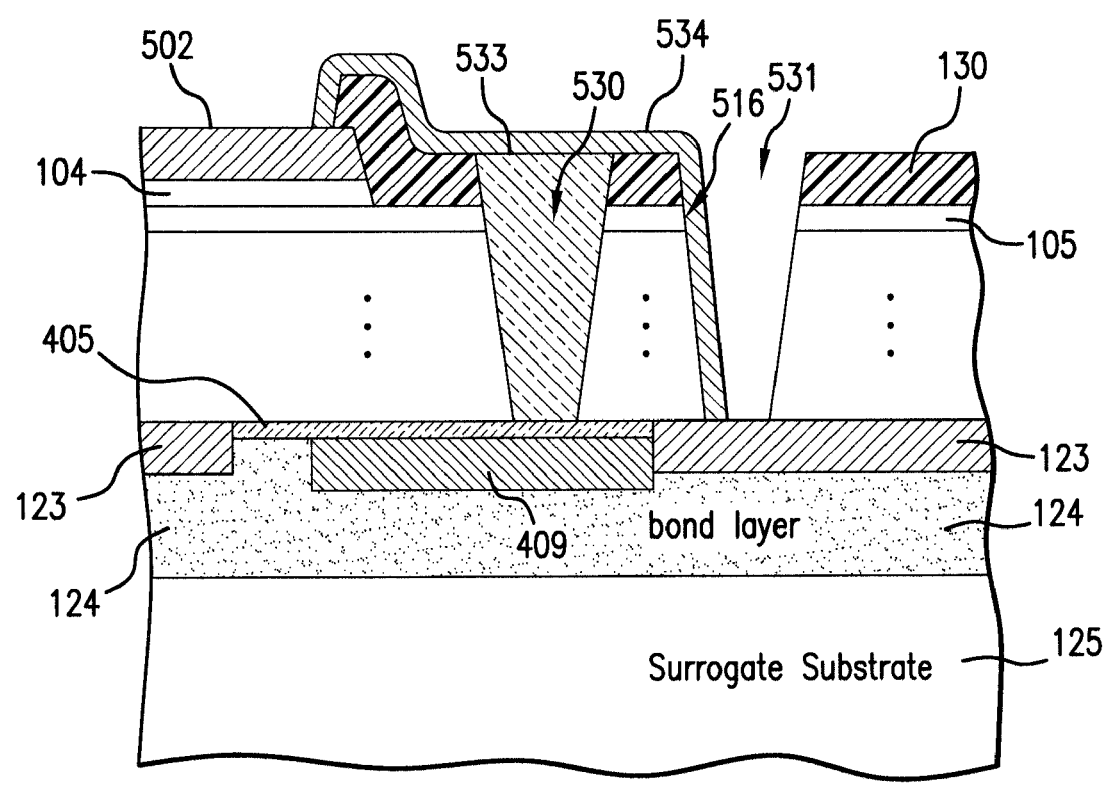
FIG. 21 is a cross-sectional view of the layered structure of FIG. 20 after the next process step in which an electrically conductive layer is formed over a portion of the cell's front side and along a side wall of the second trench.

Subsequently (FIG. 21), an electrically conductive layer 534 is formed on the front side of the cell and extends from the bus bar 502, across the first trench and the peripheral mesa 516 to continue along the sidewall of the second trench 531 down to the trench bottom. The conductive layer 534 electrically connects the front contact to the backside metal layer 123 and thus serves as cathode contact layer. For example, a sequence of layers made of Ti/Au/Ag/Au is evaporated through a photolithographic mask that is then removed.

Figure 22:
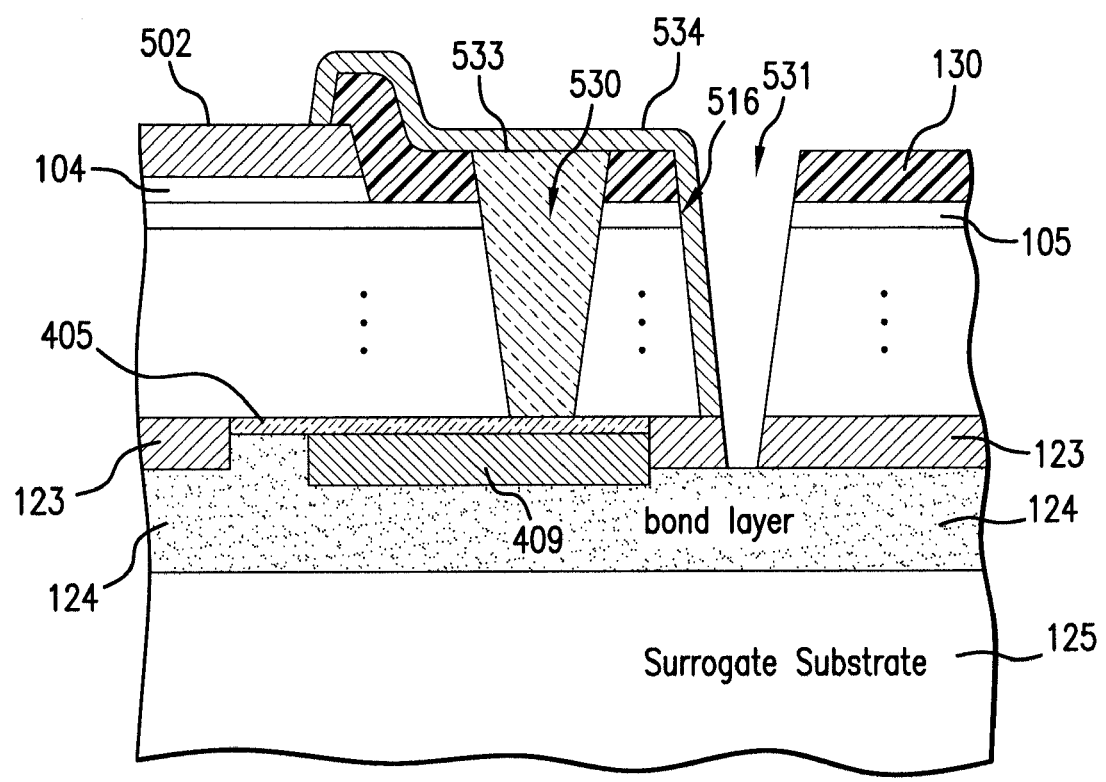
FIG. 22 is a cross-sectional view of the layered structure of FIG. 21 after the next process step in which the metal layer is removed from the bottom of the second trench.

In a next process step, shown in FIG. 22, the second annular trench 511 is exposed to a metal etchant to remove metal layer 123 from the bottom of the trench so as to substantially uncover the adhesive layer 124. It is noted that this step can be carried out, alternatively, before the formation of the conductive path in the first trench.

Figure 23:
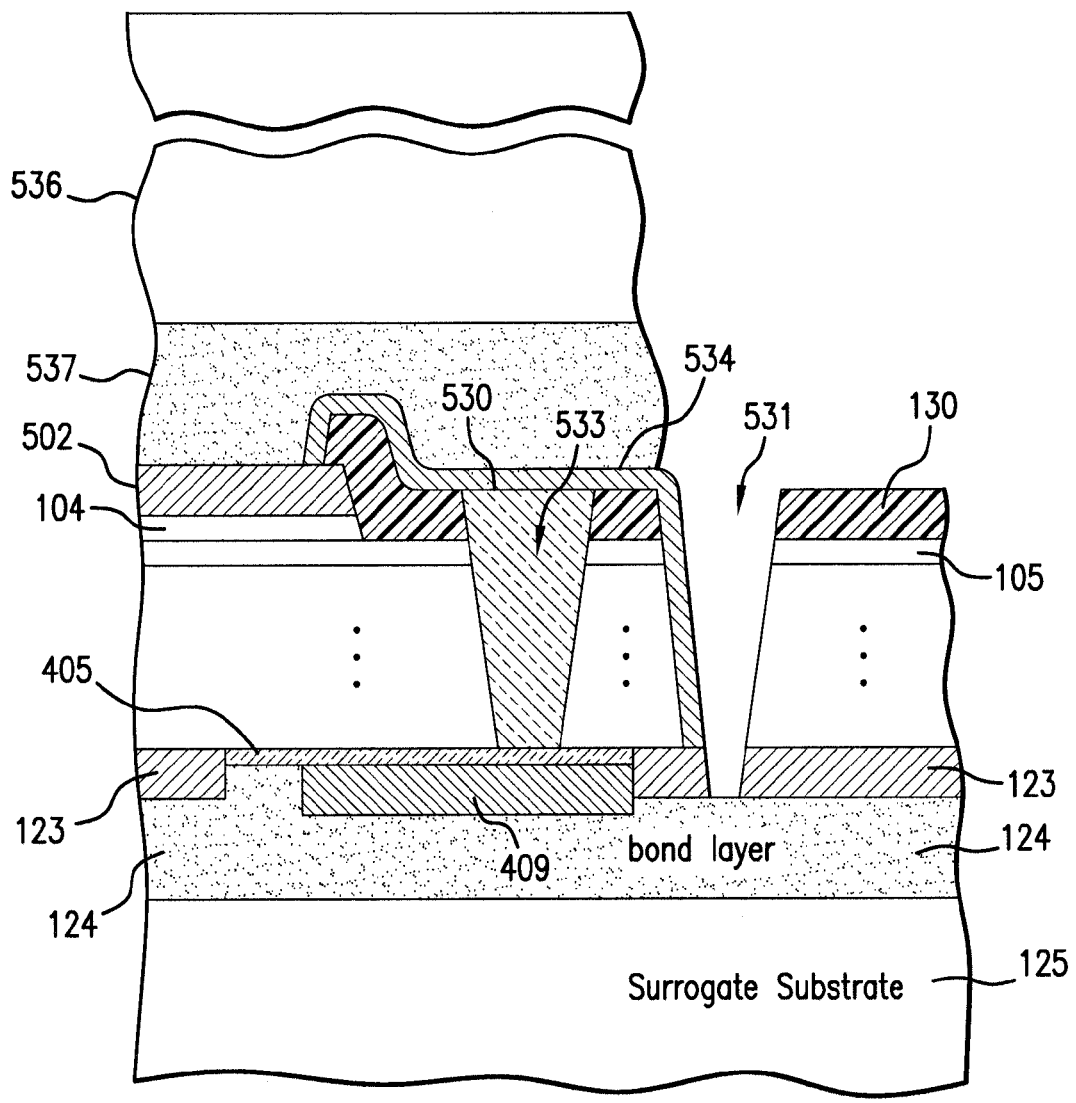
FIG. 23 is a cross-sectional view of the layered structure of FIG. 22 after the next process step of attaching on the front side of the solar cell a coverglass.

FIG. 23 is a cross-sectional view of the solar cell of FIG. 22 after the next process step of attaching on the front side of the solar cell a coverglass 536 by means of an adhesive layer 537. The coverglass 536 preferably covers the front side of the cell including the first trench 530, but does not extend above the second trench 531.

Figure 24:
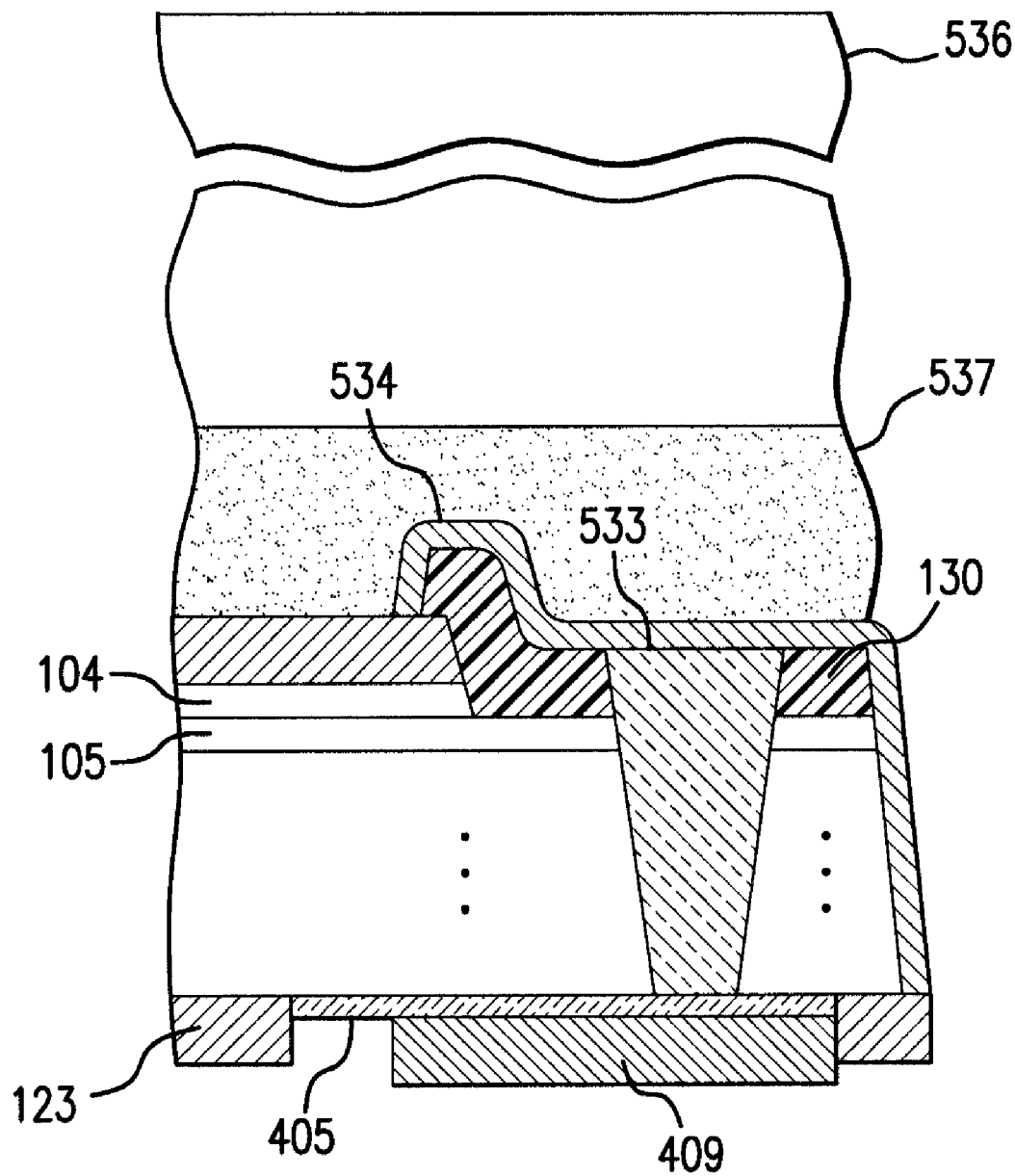
FIG. 24 is a cross-sectional view of the layered structure of FIG. 23 after the next process step of removing the surrogate substrate.

In a next process step, shown in FIG. 24, the surrogate substrate 125 and the adhesive layer 124 are entirely removed, thereby dicing the solar cell along the second trench 531 that serves as dicing street.

An individual cell is then formed comprising a via (first trench 530) that defines the peripheral boundary of its active portion filled by an insulating material and a conductive path (534) that contacts the frontside contact of the cell to the backside of the cell through an outer edge of the cell.

Advantageously, according to an aspect of the invention, dimensions and geometry of the solar cell structure can be designed such that all etching steps of the manufacturing process can be performed by means of wet etching.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The foregoing described embodiments depict different components contained within, or connected with, different other components. It is to be understood that such depicted arrangements are merely exemplary, and that in fact many other arrangements can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected" or "operably coupled" to each other to achieve the desired functionality.

While particular embodiments of the present invention have been shown and described, it will be understood by those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., in the bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

The invention claimed is:

1. A method of manufacturing a solar cell comprising:
providing a first substrate;
depositing sequentially on the first substrate a plurality of semiconductor layers, the plurality of semiconductor layers comprising a first layer and a last layer in the direction of deposition;
forming a backside contact layer on the last semiconductor layer;
forming on the last semiconductor layer a back cathode contact isolated from at least a first portion of the backside contact layer, the first portion forming the anode contact;
attaching a second substrate on the backside contact layer and removing the first substrate to expose the first semiconductor layer and to define a front surface and an opposite back surface of a solar cell;
forming a front cathode contact on the front surface of the solar cell;
etching a first trench through the plurality of semiconductor layers to define an active portion of the solar cell with a first mesa structure including the front cathode contact and the anode contact and being surrounded by the first trench, the first mesa having a first sidewall in the first trench and a lateral peripheral region beyond the sidewall, and
forming in the lateral peripheral region an electrical connection between the front electrode and the back cathode contact,
wherein the step of forming a back cathode contact comprises:
removing a second portion of the backside contact layer to expose the last semiconductor layer in a window region;

covering the window region with an electrically insulating material so as to form an electrically insulating island having a first surface area, and forming a back cathode contact on the electrically insulating island, the back cathode contact having a second surface area smaller than the first surface area so as to lie within the electrically insulating island.

2. The method of claim 1, wherein the step of forming in the lateral peripheral region an electrical connection comprises forming an electrically conductive layer extending from the front surface where it is electrically connected to the front cathode contact along the first sidewall of the first trench to be electrically connected to the back cathode contact.

3. The method of claim 1, wherein the first trench has a bottom surface and the step of etching the first trench to define a first mesa structure is realized in correspondence to the backside electrically insulating island to create an opening exposing at least a portion of the electrically insulating island on the bottom surface of the trench, and the method further comprises the steps of:

covering the first sidewall of the first trench with an electrically insulating layer;

removing the exposed portion of the electrically insulating island from the bottom surface of the first trench so as to expose the back cathode contact, and depositing an electrically conductive layer extending from the front surface where it is electrically connected to the front cathode contact, along the first sidewall of the first trench over the electrically insulating layer and down to the exposed back cathode contact.

4. The method of claim 1, further comprising etching a second trench lying outside an outer edge of the first trench to define a peripheral second mesa structure in the lateral peripheral region having an inner sidewall in the first trench facing the first sidewall of the first mesa structure and an outer sidewall in the second trench.

5. The method of claim 4, wherein the step of etching a first trench is realized by etching the first trench around the active portion of the solar cell, the first trench having an annular shape in a front surface view and the second trench being an annular trench surrounding the first trench.

6. The method of claim 4, wherein the back cathode contact has an edge extending laterally beyond the outer sidewall of the second mesa structure.

7. The method of claim 4, further comprising:

filling with an electrically insulating layer the first trench so as to cover the first sidewall of the first mesa structure and the inner sidewall of the second mesa structure, and depositing an electrically conductive layer extending from the front cathode contact along the outer sidewall of the second mesa to be electrically connected to the back cathode contact.

8. The method of claim 4, further comprising, after the step of forming in the lateral peripheral region an electrically conductive layer, the steps of:

attaching a cover substrate on the front surface of the solar cell;

removing the backside contact layer from an exposed area on the bottom of the second trench, and removing the second substrate from the back surface of the cell so as to dice the solar cell from the second substrate through the second trench.

9. The method of claim 1, wherein the step of depositing the plurality of semiconductor layers comprises epitaxially growing in sequence each semiconductor layer of the plurality on the first substrate and each of the plurality of semiconductor layers being made of III-V group compound semiconductor material.

10. The method of claim 1, wherein the step of etching a first trench is realized by etching the first trench around a periphery of the active portion the solar cell, the first trench having an annular shape in a front surface view.

11. The method of claim 1, wherein removing the first substrate allows light from the front surface of the solar cell to enter the plurality of semiconductor layers.

12. The method of claim 11, wherein the solar cell is an inverted metamorphic multijunction solar cell.

13. The method of claim 1, further comprising attaching a coverglass to the front side of the solar cell.

14. The method of claim 13, wherein the solar cell is an inverted metamorphic multijunction solar cell.

15. The method of claim 14, wherein light from the front surface of the solar cell can pass through the coverglass to enter the plurality of semiconductor layers.

16. The method of claim 13, further comprising removing the second substrate from the back surface of the solar cell.

* * * * *